United States Patent
Sato

(10) Patent No.: US 11,881,608 B2
(45) Date of Patent: Jan. 23, 2024

(54) FILTER DEVICE

(71) Applicant: Murata Manufacturing Co., Ltd., Nagaokakyo (JP)

(72) Inventor: Tomoya Sato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 590 days.

(21) Appl. No.: 17/088,637

(22) Filed: Nov. 4, 2020

(65) Prior Publication Data

US 2021/0184324 A1    Jun. 17, 2021

(30) Foreign Application Priority Data

Dec. 11, 2019   (JP) ................. 2019-223404
Jun. 26, 2020   (JP) ................. 2020-110656

(51) Int. Cl.
   *H03H 9/64*     (2006.01)
   *H03H 9/145*    (2006.01)
   *H03H 9/25*     (2006.01)
   *H01P 1/20*     (2006.01)
   *H03H 9/02*     (2006.01)

(52) U.S. Cl.
   CPC ......... *H01P 1/20* (2013.01); *H03H 9/02543* (2013.01); *H03H 9/14582* (2013.01); *H03H 9/25* (2013.01); *H03H 9/6406* (2013.01); *H03H 9/6483* (2013.01)

(58) Field of Classification Search
   CPC .............. H03H 9/02; H03H 9/25; H03H 9/64
   See application file for complete search history.

(56) References Cited

U.S. PATENT DOCUMENTS

| | | | |
|---|---|---|---|
| 6,034,577 A | 3/2000 | Matsui et al. | |
| 7,030,716 B2 * | 4/2006 | Tsutsumi | H03H 9/725 333/133 |
| 8,502,621 B2 * | 8/2013 | Uesaka | H03H 9/6426 333/133 |
| 9,806,692 B2 * | 10/2017 | Kishino | H03H 9/02614 |

(Continued)

FOREIGN PATENT DOCUMENTS

| CN | 107026634 A | 8/2017 |
|---|---|---|
| CN | 107623504 A | 1/2018 |

(Continued)

OTHER PUBLICATIONS

First Office Action in KR1020200170735, dated Jan. 20, 2023, 5 pages.

(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

A filter device includes a first filter connected between a common terminal and a first individual terminal, and a second filter connected between the common terminal and a second individual terminal. A pass band of the second filter is in a frequency range lower than a pass band of the first filter. The first filter includes SAW resonators, at least one of which includes divided resonators connected in parallel with each other. Each of the divided resonators includes an IDT. A pitch of the IDT of one of the divided resonators is different from that of another of the divided resonators.

20 Claims, 16 Drawing Sheets

(56) References Cited

U.S. PATENT DOCUMENTS

| | | | |
|---|---|---|---|
| 9,860,006 B1* | 1/2018 | Okuda | .................... G06F 13/22 |
| 9,998,098 B2* | 6/2018 | Takata | ................. H03H 9/6483 |
| 10,193,530 B2* | 1/2019 | Takamine | ............ H04B 1/0057 |
| 10,601,570 B2 | 3/2020 | Takamine | |
| 2017/0117873 A1 | 4/2017 | Takata | |
| 2017/0272057 A1 | 9/2017 | Takata | |
| 2018/0019832 A1 | 1/2018 | Okuda | |
| 2018/0109243 A1* | 4/2018 | Takamine | ................ H03H 9/72 |
| 2019/0149312 A1 | 5/2019 | Takamine | |
| 2019/0253037 A1 | 8/2019 | Konaka | |

FOREIGN PATENT DOCUMENTS

| | | |
|---|---|---|
| CN | 109478880 A | 3/2019 |
| KR | 101914890 B1 | 11/2018 |
| KR | 1020190010606 A | 1/2019 |
| KR | 1020190065401 A | 6/2019 |
| WO | 2018/003297 A1 | 1/2018 |

OTHER PUBLICATIONS

Office Action in CN202011431620.2, dated Aug. 17, 2023, 16 pages.

\* cited by examiner

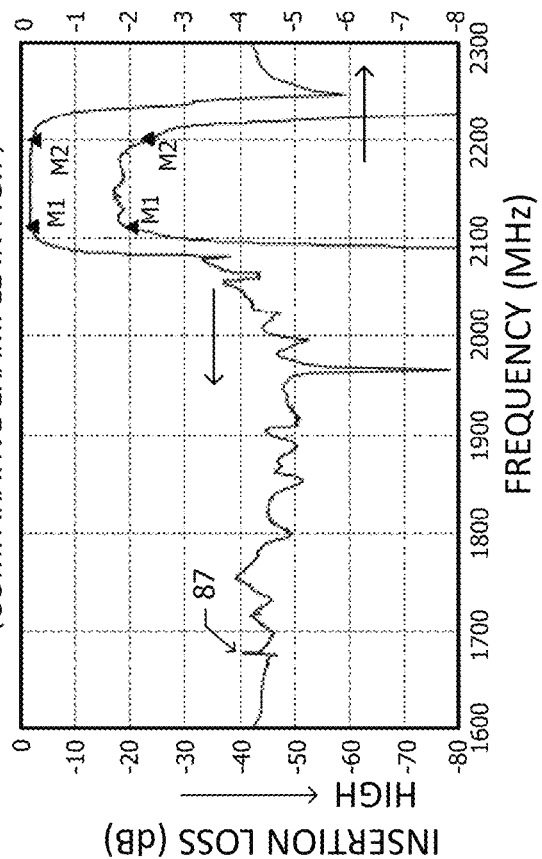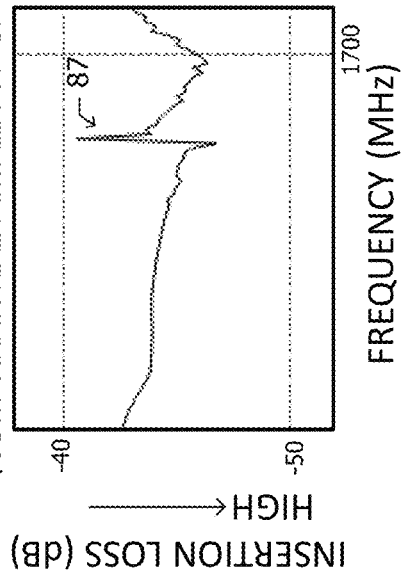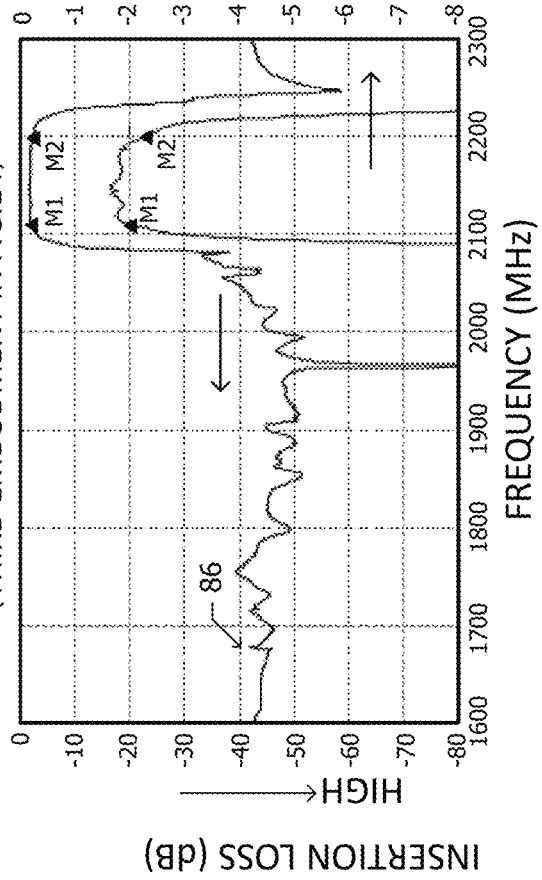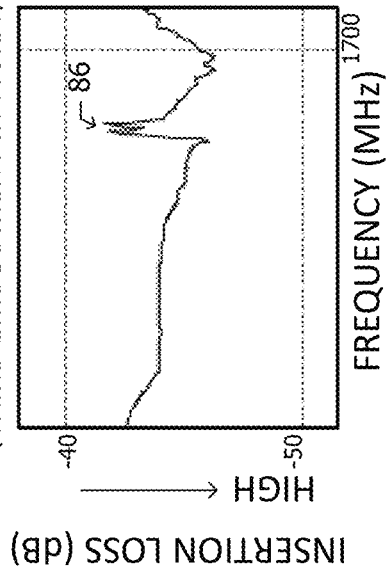

FILTER DEVICE

CROSS REFERENCE TO RELATED APPLICATIONS

This application claims the benefit of priority to Japanese Patent Application No. 2020-110656 filed on Jun. 26, 2020 and Japanese Patent Application No. 2019-223404 filed on Dec. 11, 2019. The entire contents of these applications are hereby incorporated herein by reference.

BACKGROUND OF THE INVENTION

1. Field of the Invention

The present invention relates to a filter device.

2. Description of the Related Art

As a bandpass filter used in a communication apparatus, such as in a mobile information terminal, a filter using surface acoustic wave (SAW) elements is utilized. To support multiple frequency bands with one antenna, a multiplexer including multiple duplexers is used. A multiplexer includes a plurality of bandpass filters, for example. An example of such a multiplexer is disclosed in International Publication No. 2018/003297.

To achieve a desired pass band, a bandpass filter using SAW elements includes multiple SAW resonators connected with each other. In a SAW resonator utilizing leaky waves or shear horizontal (SH) waves as the main waves, resonance may be produced due to unwanted waves, such as Rayleigh waves, at a frequency lower than the fundamental resonant frequency of the main waves. This may cause a ripple in the bandpass characteristics in the stopband of the bandpass filter, which may adversely influence the attenuation characteristics in the stopband of the bandpass filter.

Additionally, when a plurality of bandpass filters having different pass bands are connected to a single common terminal, a ripple due to unwanted waves produced in one bandpass filter may adversely influence the bandpass characteristics in the pass band of a different bandpass filter if the frequency of the ripple is included in the pass band of this different bandpass filter.

SUMMARY OF THE INVENTION

Preferred embodiments of the present invention provide filter devices that are each able to reduce ripples caused by unwanted waves.

According to a preferred embodiment of the present invention, a filter device includes a common terminal, first and second individual terminals, and first and second filters. The first filter is connected between the common terminal and the first individual terminal. The second filter is connected between the common terminal and the second individual terminal. The pass band of the second filter is in a frequency range lower than the pass band of the first filter. The first filter includes a plurality of surface acoustic wave (SAW) resonators. At least one of the plurality of SAW resonators is includes a plurality of divided resonators connected in parallel with each other. Each of the plurality of divided resonators includes an interdigital transducer (IDT). The plurality of divided resonators include at least two divided resonators. Among the at least two divided resonators, the pitch of the IDT of a divided resonator is different from that of another divided resonator.

According to a preferred embodiment of the present invention, a filter device includes a SAW filter including plurality of SAW resonators. At least one of the plurality of SAW resonators includes a plurality of divided resonators connected in parallel with each other. Each of the plurality of divided resonators includes an IDT. Among the plurality of divided resonators, the pitch of the IDT of a divided resonator is different from that of another divided resonator. (Pmax−Pmin)/Pa is about 0.7% or smaller, where Pa is the average of the pitches of the IDTs of the plurality of divided resonators, and Pmax and Pmin are the maximum value and the minimum value, respectively, of the pitches of the IDTs of the plurality of divided resonators.

According to a preferred embodiment of the present invention, a filter device includes a substrate and a plurality of SAW resonators. The substrate is made of a piezoelectric material. The plurality of SAW resonators are disposed on the substrate and are connected with each other. At least one of the plurality of SAW resonators includes a plurality of divided resonators connected in parallel with each other. Each of the plurality of divided resonators includes an IDT. Among the plurality of divided resonators, the pitch of the IDT of a divided resonator is different from that of another divided resonator. Among the plurality of divided resonators, the arrangement direction of electrode fingers of the IDT of a divided resonator is parallel or substantially parallel with that of another divided resonator. The IDTs of the plurality of divided resonators are displaced from each other in a direction perpendicular or substantially perpendicular to the arrangement direction of the electrode fingers.

With the use of SAW resonators including a plurality of parallel-connected divided resonators, ripples caused by unwanted waves produced in each of the SAW resonators are able to be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 15A and 15B are graphs illustrating the measurement results of the bandpass characteristics in the path from a common terminal to a second individual terminal in the filter device of the third preferred embodiment of the present invention shown in FIG. 14.

FIGS. 15C and 15D are graphs illustrating the measurement results of the bandpass characteristics in the path from the common terminal to the second individual terminal in the filter device of the comparative example shown in FIG. 7.

DETAILED DESCRIPTION OF THE PREFERRED EMBODIMENTS

Preferred embodiments of the present invention will be described in detail below with reference to the drawings.

First Preferred Embodiment

A filter device according to a first preferred embodiment will be described below with reference to FIGS. 1 through 4B.

Figure 1:
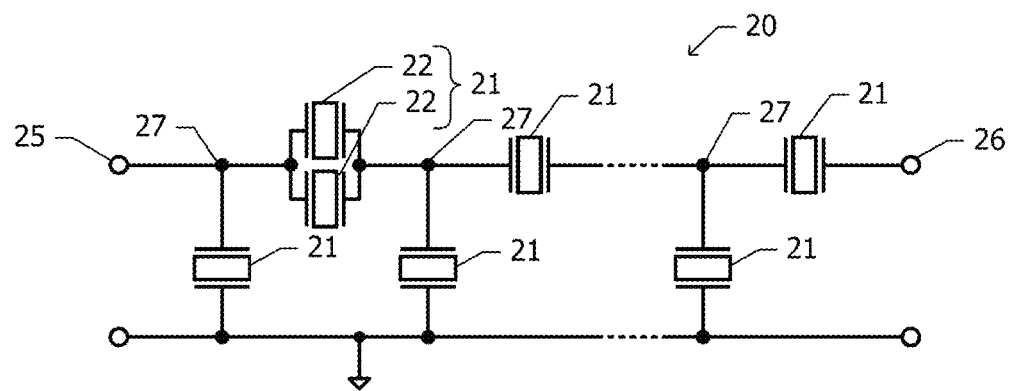
FIG. 1 is an equivalent circuit diagram of a filter device according to a first preferred embodiment of the present invention.

FIG. 1 is an equivalent circuit diagram of a filter device 20 according to the first preferred embodiment. The filter device 20 is a ladder filter device including a plurality of surface acoustic wave (SAW) resonators 21. Parallel arms branch off from branch nodes 27 of a series arm connecting a first terminal 25 and a second terminal 26. Each of the parallel arms is grounded on the other side opposite the corresponding branch node of the series arm. A ladder filter device refers to a filter device using series elements and parallel elements of a ladder circuit as resonators. A ladder circuit includes one input terminal, one output terminal, and a ground terminal to which an input/output ground potential is supplied. The series elements are elements connected between the input terminal and the output terminal of the ladder circuit. The parallel elements are elements connected between the corresponding series elements and the ground potential.

At least one SAW resonator 21 is interposed between two adjacent branch nodes 27 of the series arm and also on each of multiple parallel arms. The SAW resonators 21 disposed on the series arm may also be called series arm resonators, while the SAW resonators 21 disposed on the parallel arms may also be called parallel arm resonators. The SAW resonator 21, which is the series arm resonator disposed between the first and second branch nodes as seen from the first terminal 25, includes two divided resonators 22 connected in parallel with each other. Each of the divided resonators 22 includes an interdigital transducer (IDT) including a pair of interlocking comb-shaped electrodes. The pitch of multiple electrode fingers of the IDT (hereinafter simply called the IDT pitch) of one divided resonator 22 is different from that of the other divided resonator 22. The SAW resonators 21 are designed to utilize, for example, leaky waves or shear horizontal (SH) waves as the main waves.

In a broad sense, each of the divided resonators 22 can be regarded as one SAW resonator. In this specification, however, a SAW resonator including a plurality of parallel-connected divided resonators is distinguished from a SAW resonator which is a resonator divided from this SAW resonator. Due to the manufacturing variations, the IDT pitch may be varied within an allowance. In this case, the IDT pitch P is defined as $P=L/(N-1)$ where L is the center-to-center distance between the electrode fingers of an IDT positioned at both ends and N is the number of electrode fingers.

Advantages of the first preferred embodiment will be explained below in comparison with a comparative example.

Figure 2:
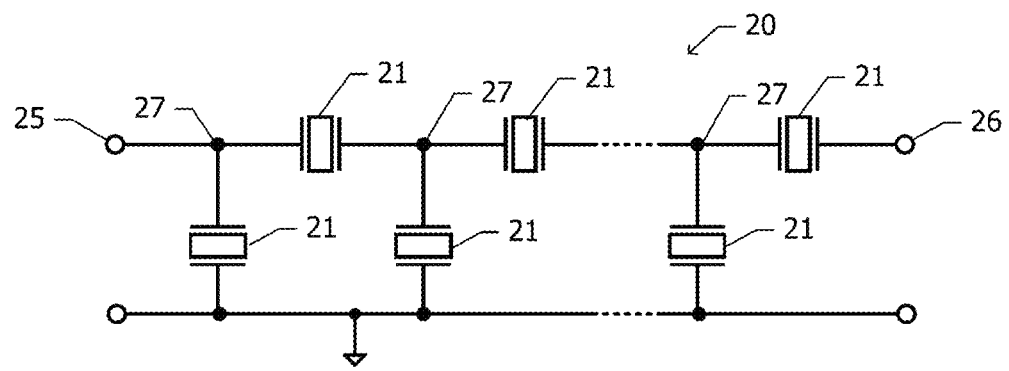
FIG. 2 is an equivalent circuit diagram of a filter device according to a comparative example.

FIG. 2 is an equivalent circuit diagram of a filter device 20 according to a comparative example. The circuit configuration of the filter device 20 according to the comparative example is the same or substantially the same as that of the first preferred embodiment shown in FIG. 1, except for the following point. As opposed to the SAW resonator 21 including the two divided resonators 22 in the first preferred embodiment, the corresponding SAW resonator 21 in the comparative example is not divided into multiple resonators, but includes the single SAW resonator. The other SAW resonators 21 in the comparative example have the same or substantially the same characteristics as those of the first preferred embodiment.

Figure 3A:
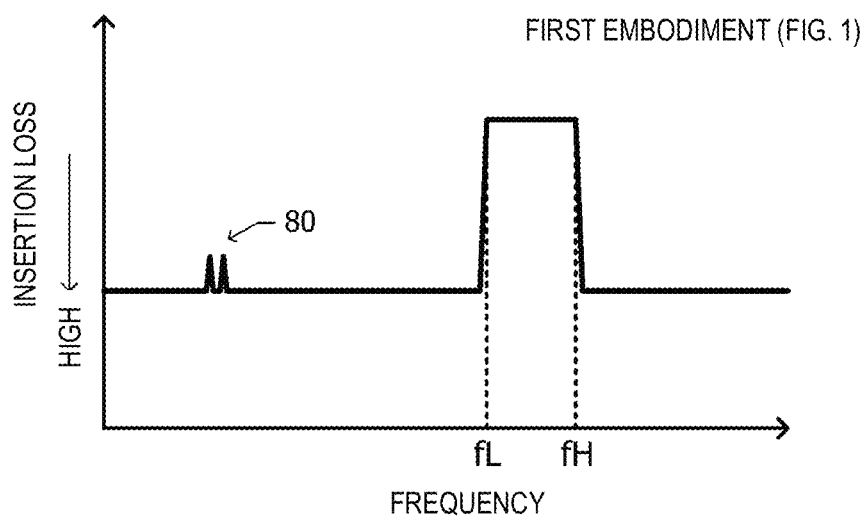
FIG. 3A is a graph schematically illustrating the bandpass characteristics of the filter device of the first preferred embodiment of the present invention shown in FIG. 1.
Figure 3B:
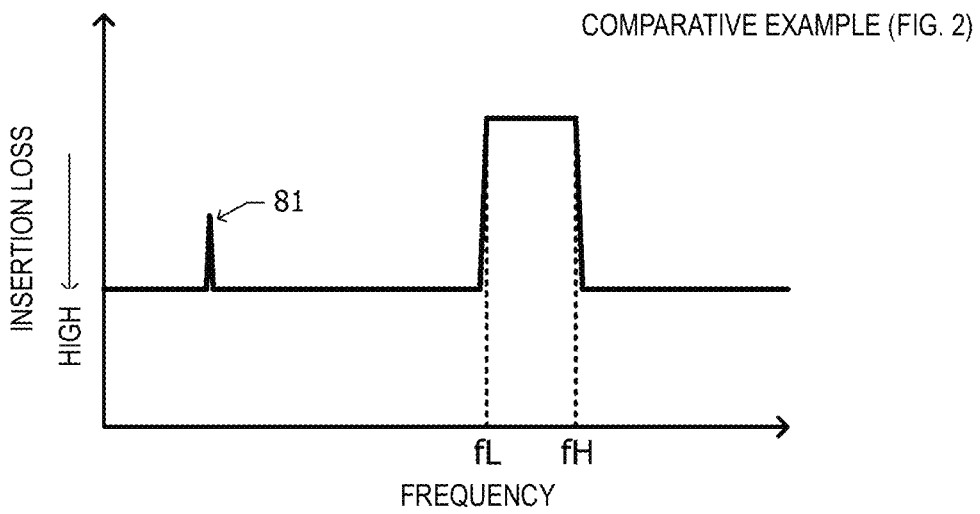
FIG. 3B is a graph schematically illustrating the bandpass characteristics of the filter device of the comparative example shown in FIG. 2.

FIG. 3A is a graph schematically illustrating the bandpass characteristics of the filter device 20 according to the first preferred embodiment (FIG. 1). FIG. 3B is a graph schematically illustrating the bandpass characteristics of the filter device 20 according to the comparative example (FIG. 2). In FIGS. 3A and 3B, only distinctive portions are shown in detail, while the other portions are shown in a simplified manner. In the graphs, the horizontal axis indicates the frequency, while the vertical axis indicates the insertion loss. The insertion loss increases downward on the vertical axis.

Both of the filter device 20 of the first preferred embodiment and that of the comparative example are bandpass filters having a lower cutoff frequency at fL and a higher cutoff frequency at fH. In the filter device 20 of the first preferred embodiment (FIG. 1), two ripples 80 occur in the frequency range lower than the pass band. The pass band of a bandpass filter is the frequency band between the lower cutoff frequency and the higher cutoff frequency. As the lower cutoff frequency and the higher cutoff frequency, the frequencies at which the highest level of power in the pass band drops by about 3 dB, in other words, the frequencies at which the smallest insertion loss increases by about 3 dB, are used. The ripples 80 occur due to unwanted waves produced in the respective two divided resonators 22, and more specifically, due to Rayleigh waves. Ripples caused by Rayleigh waves may also be called a Rayleigh response. Since the IDT pitch of one divided resonator 22 is different from that of the other divided resonator 22, the resonant frequencies of the two divided resonators 22 corresponding to the unwanted waves slightly differ from each other. This is why the two ripples 80 occur in response to the two divided resonators 22.

In contrast, in the filter device 20 of the comparative example (FIG. 2), the SAW resonator 21 corresponding to the SAW resonator 21 including the two divided resonators 22 in the first preferred embodiment includes only a single SAW resonator. As a ripple caused by unwanted waves produced in this SAW resonator 21, only one ripple 81 is observed, as shown in FIG. 3B. The insertion loss at the frequency at which the ripple 81 is observed is smaller than that in the other portions of the stopband, thus failing to obtain desired filter characteristics. It is thus preferable to regulate a drop in the insertion loss caused by the ripple 81 so that the insertion loss at the frequency of the ripple 81 becomes as large as that in the other portions of the stopband.

In the first preferred embodiment, the two ripples 80 occur in response to the unwanted waves. Accordingly, a drop in the insertion loss caused by each of the two ripples 80 becomes smaller than that by the single ripple 81 in the comparative example. In the first preferred embodiment, therefore, the attenuation characteristics in the frequency bands other than the pass band are not decreased as much as those of the comparative example.

The difference in the IDT pitch between the two divided resonators 22 is small, and the total capacitance of the two divided resonators 22 is equal or substantially equal to the capacitance of the corresponding single SAW resonator 21 of the filter device 20 of the comparative example. Thus, even if the single SAW resonator 21 is replaced by the two divided resonators 22 after a filter is designed with the circuit configuration of the comparative example (FIG. 2), the filter characteristics of the pass band and its adjacent bands remain almost unchanged. It is thus not necessary to design a new filter in the configuration in which the single SAW resonator 21 is replaced by the two divided resonators 22. Accordingly, it does not become more difficult to design the filter device 20 of the first preferred embodiment than to design the comparative example.

If the difference in the IDT pitch between the two divided resonators 22 is too small, the two ripples 80 occurring in response to unwanted waves do not sufficiently separate from each other. This fails to fully achieve the advantageous effect of regulating a drop in the insertion loss caused by the ripples 80. If the difference in the IDT pitch between the two divided resonators 22 is too large, the filter characteristics of the pass band and its adjacent bands significantly vary. It is thus preferable to set the difference in the IDT pitch between the two divided resonators 22 so that the ripples 80 can be clearly separated from each other and the filter characteristics of the pass band and its adjacent bands are not significantly influenced. As an example, Pd/Pa is preferably set to be about 0.02% to about 0.7%, where Pd is the difference in the IDT pitch between the two divided resonators 22 and Pa is the average of the IDT pitches of the two divided resonators 22. The basis for the upper limit and the lower limit in this preferable range of the difference in the IDT pitch will be discussed later with reference to FIG. 11.

The arrangement of the IDTs of the two divided resonators 22 (FIG. 1) will be discussed below with reference to FIGS. 4A and 4B.

Figure 4A:
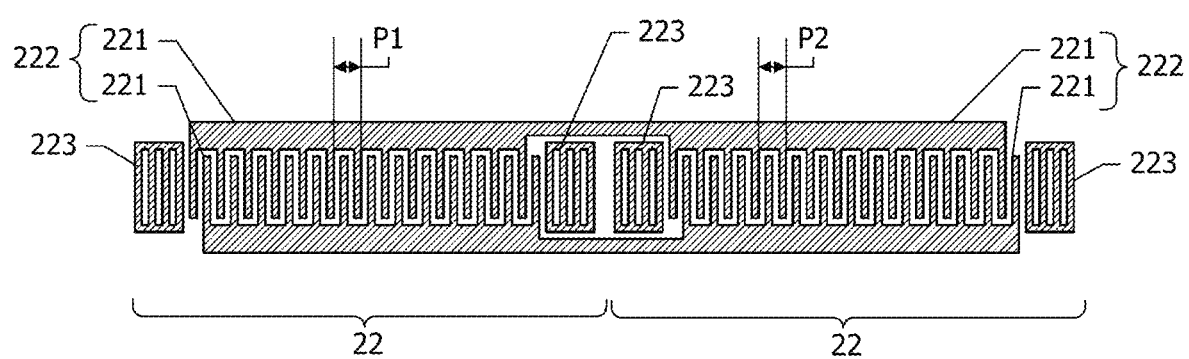
FIGS. 4A and 4B are schematic plan views illustrating examples of the arrangement of interdigital transducers (IDTs) of two parallel-connected divided resonators of the filter device shown in FIG. 1.

FIG. 4A is a schematic plan view illustrating an example of the arrangement of the IDTs of the two divided resonators 22 (FIG. 1). Electrode fingers of the IDTs shown in FIG. 4A are fewer than those of the actual IDTs. A pair of interlocking comb-shaped electrodes 221 define an IDT 222. The pitch of the IDT 222 of one divided resonator 22 is indicated by P1, while that of the other divided resonator 22 is indicated by P2. The multiple electrode fingers of the IDTs 222 of the two divided resonators 22 are aligned. Reflectors 223 are disposed at both sides of each of the two IDTs 222. The reflectors 223 reflect SAWs having the resonance wavelength of the corresponding IDT 222.

Figure 4B:
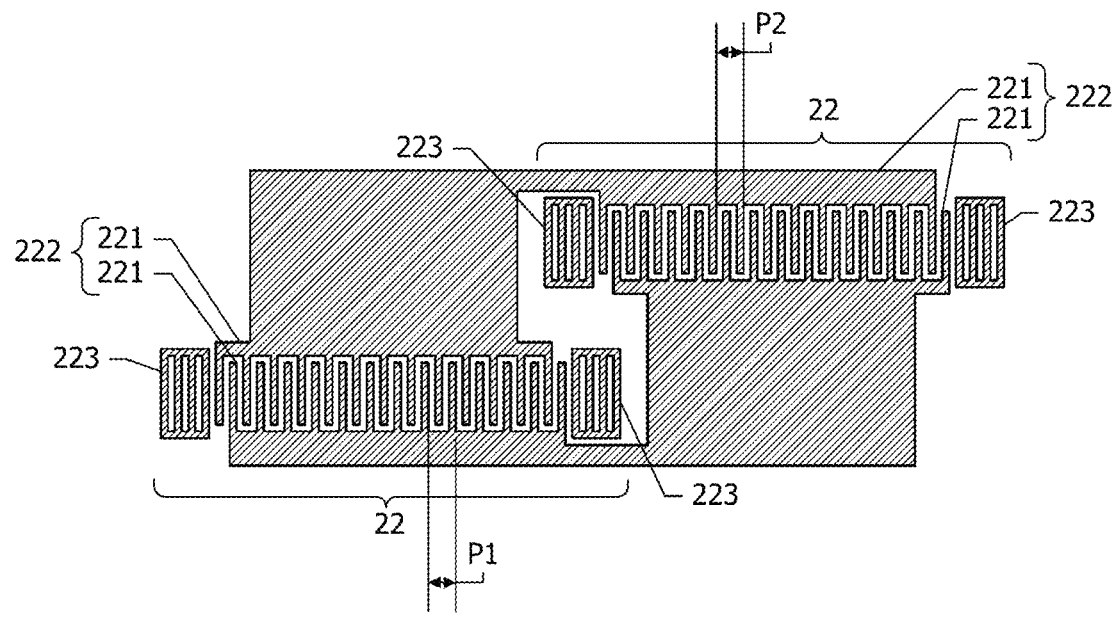

FIG. 4B is a schematic plan view illustrating another example of the arrangement of the IDTs of the two divided resonators 22 (FIG. 1). In the example in FIG. 4B, the arrangement direction of the plurality of electrode fingers of the IDT 222 of one divided resonator 22 is parallel or substantially parallel with that of the other divided resonator 22. The two IDTs 222 are displaced from each other in the direction perpendicular or substantially perpendicular to the arrangement direction of the electrode fingers. The reflector 223 disposed at one side of one IDT 222 partially overlaps the other IDT 222 or the reflector 223 disposed at one side of the other IDT 222 in the arrangement direction of the electrode fingers.

It is possible to make the total dimensions of the two divided resonators 22 shown in FIG. 4A smaller than those in FIG. 4B in the direction perpendicular or substantially perpendicular to the arrangement direction of the electrode fingers. It is possible to make the total dimensions of the two divided resonators 22 shown in FIG. 4B smaller than those in FIG. 4A in the direction parallel or substantially parallel with the arrangement direction of the electrode fingers. A preferable one of the two arrangements shown in FIGS. 4A and 4B may be selected in terms of the relationship with the other SAW resonators 21 (FIG. 1).

Various modified examples of the first preferred embodiment will be described below.

In the first preferred embodiment (FIG. 1), the SAW resonator 21 interposed between the first and second branch nodes 27 of the series arm as seen from the first terminal 25 includes two divided resonators 22. Another SAW resonator 21 may include two divided resonators 22. For example, the SAW resonator 21 disposed between branch nodes 27 of the series arm positioned closer to the second terminal 26 with respect to the second branch node 27 seen from the first terminal 25 may include two divided resonators 22. A SAW resonator 21 disposed on a parallel arm may include two divided resonators 22.

In the first preferred embodiment (FIG. 1), one SAW resonator 21 includes two divided resonators 22, for example. Alternatively, each of multiple SAW resonators 21 may include two parallel-connected divided resonators 22. Additionally, one or multiple SAW resonators 21 may each include three or more parallel-connected divided resonators 22, for example. In this case, it is preferable that (Pmax−Pmin)/Pa is about 0.02% to about 0.7%, where Pmax and Pmin are the maximum value and the minimum value, respectively, of the IDT pitches of the multiple divided resonators 22, and Pa is the average of the IDT pitches of the multiple divided resonators 22.

In the first preferred embodiment (FIG. 1), both of the series arm resonator and the parallel arm resonator are connected to the first terminal 25, while only the series arm resonator is connected to the second terminal 26. Alternatively, both of the series arm resonator and the parallel arm resonator may be connected to each of the first and second terminals 25 and 26. Conversely, parallel arm resonators may be connected to neither of the first terminal 25 nor the second terminal 26.

In the first preferred embodiment (FIG. 1), the ladder filter includes a plurality of series arm resonators and a plurality of parallel arm resonators, for example. However, the ladder filter may include one series arm resonator and a plurality of parallel arm resonators, or a plurality of series arm resonators and one parallel arm resonator, or one series arm resonator and one parallel arm resonator. In such a ladder filter, at least one SAW resonator may include multiple parallel-connected divided resonators. For example, a T-type filter, a π-type filter, and an L-type filter are examples of such a ladder filter. A filter device including a plurality of SAW resonators provided in a circuit configuration other than that of the ladder filter of the first preferred embodiment (FIG. 1), may be used. In such a filter device, one of the SAW resonators may include multiple parallel-connected divided resonators.

In the first preferred embodiment (FIG. 1), leaky waves or SH waves, for example, are preferably utilized as the main waves. Although the ripples 80 occur due to Rayleigh waves, which are unwanted waves, in a stopband of the bandpass characteristics, a drop in the insertion loss caused by the ripples 80 can be regulated. Alternatively, another type of acoustic waves may be utilized as the main waves. In this case, although ripples 80 occur due to unwanted waves in the frequency range lower than the resonant frequency of the main waves, a drop in the insertion loss caused by the ripples 80 can be regulated by the application of the configuration of the first preferred embodiment.

In the first preferred embodiment, the IDT pitch of the same divided resonator 22 is preferably constant or substantially constant. However, the IDT pitch may be changed, for example, progressively or in a stepwise manner in the same divided resonator 22. The IDT pitch of a SAW resonator 21 other than the SAW resonator 21 including the divided resonators 22 may also be changed. Changing the IDT pitch in the same SAW resonator 21 can reduce ripples in the pass band.

If the IDT pitch is varied in each of the two divided resonators 22, the average of the IDT pitches of one divided resonator 22 is set to be different from that of the other divided resonator 22. As an example, when the average IDT pitch of one divided resonator 22 is Pa1 and that of the other divided resonator 22 is Pa2, the difference between the average IDT pitches Pa1 and Pa2 is used as the difference Pd in the IDT pitch between the two divided resonators 22, and the average of the average pitches Pa1 and Pa2 is used as the average Pa of the IDT pitches of the two divided resonators 22. As in the first preferred embodiment, Pd/Pa is preferably set to be about 0.02% to about 0.7%, for example.

Second Preferred Embodiment

A filter device according to a second preferred embodiment of the present invention will be described below with reference to FIGS. 5 through 13B. An explanation of the elements configured similarly to those of the filter device 20 of the first preferred embodiment (FIG. 1) will be omitted.

Figure 5:
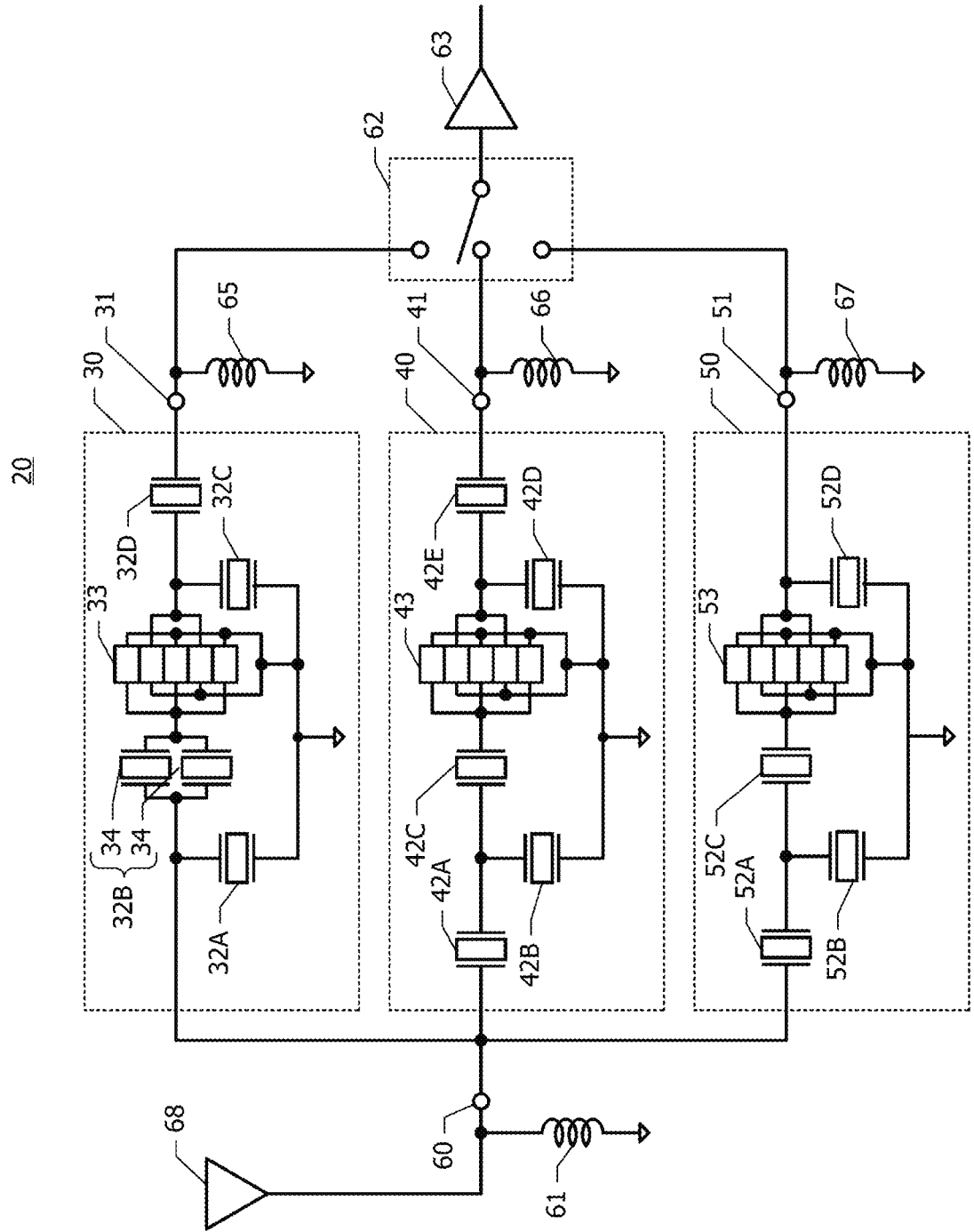
FIG. 5 is an equivalent circuit diagram of a filter device according to a second preferred embodiment of the present invention.

FIG. 5 is an equivalent circuit diagram of a filter device 20 according to the second preferred embodiment. The filter device 20 of the second preferred embodiment includes a first bandpass filter 30, a second bandpass filter 40, a third bandpass filter 50, a common terminal 60, a first individual terminal 31, a second individual terminal 41, and a third individual terminal 51. The first bandpass filter 30 is connected between the common terminal 60 and the first individual terminal 31. The second bandpass filter 40 is connected between the common terminal 60 and the second individual terminal 41. The third bandpass filter 50 is connected between the common terminal 60 and the third individual terminal 51.

The common terminal 60 is connected to an antenna 68. An impedance matching inductor 61 is connected between the common terminal 60 and a ground. The first, second, and third individual terminals 31, 41, and 51 are connected to a low-noise amplifier 63 via a switch 62. Impedance matching inductors 65, 66, and 67 are respectively connected between the first, second, and third individual terminals 31, 41, and 51 and a ground.

The filter device 20 of the second preferred embodiment is a receiver triplexer that separates radio-frequency (RF) signals received by the antenna 68 into RF signals in three frequency bands. For example, the pass bands of the first, second, and third bandpass filters 30, 40, and 50 preferably correspond to those standardized by the third generation partnership project (3GPP). More specifically, for example, the pass band of the first bandpass filter 30 is equal or substantially equal to Band 41 downlink frequency band (about 2496 MHz to about 2690 MHz), the pass band of the second bandpass filter 40 is equal or substantially equal to Band 66 downlink frequency band (about 2110 MHz to about 2200 MHz), and the pass band of the third bandpass filter 50 is equal or substantially equal to Band 3 downlink frequency band (about 1805 MHz to about 1880 MHz). That is, the pass band of the second bandpass filter 40 is lower than that of the first bandpass filter 30, and the pass band of the third bandpass filter 50 is lower than that of the second bandpass filter 40.

Each of the first, second, and third bandpass filters 30, 40, and 50 is preferably a ladder SAW filter, for example.

The first bandpass filter 30 includes SAW resonators 32A, 32B, 32C, and 32D and one longitudinally coupled SAW filter 33. The SAW resonator 32B is disposed between the first and second branch nodes of the series arm as seen from the common terminal 60. As in the SAW resonator 21 disposed between the first and second branch nodes 27 of the series arm as seen from the first terminal 25 in the filter device 20 of the first preferred embodiment (FIG. 1), the SAW resonator 32B includes two parallel-connected divided resonators 34. The longitudinally coupled SAW filter 33 is inserted between the SAW resonator 32B and the second branch node.

No SAW resonator is interposed between the common terminal 60 and the first branch node as seen from the common terminal 60. The SAW resonator 32D is connected between the second branch node and the first individual terminal 31. As seen from the common terminal 60, the SAW resonator 32A is disposed on the parallel arm which branches off from the first branch node of the series arm, while the SAW resonator 32C is disposed on the parallel arm which branches off from the second branch node of the series arm. Each of the SAW resonators 32A, 32C, and 32D may include a plurality of divided resonators connected in series with each other.

The second bandpass filter 40 includes five SAW resonators 42A, 42B, 42C, 42D, and 42E and one longitudinally coupled SAW filter 43. The SAW resonator 42A is connected between the common terminal 60 and the first branch node as seen from the common terminal 60. The SAW resonator 42C and the longitudinally coupled SAW filter 43 are connected in series with each other between the first and second branch nodes. The SAW resonator 42E is connected between the second branch node and the second individual terminal 41. The SAW resonator 42B is disposed on the parallel arm which branches off from the first branch node of the series arm, while the SAW resonator 42D is disposed on the parallel arm which branches off from the second branch node of the series arm. Each of the SAW resonators 42A through 42E may include a plurality of series-connected divided resonators.

The third bandpass filter 50 includes four SAW resonators 52A, 52B, 52C, and 52D and one longitudinally coupled SAW filter 53. The SAW resonator 52A is connected between the common terminal 60 and the first branch node as seen from the common terminal 60. The SAW resonator 52C and the longitudinally coupled SAW filter 53 are connected in series with each other between the first and second branch nodes. The SAW resonator 52B is disposed on the parallel arm which branches off from the first branch node of the series arm, while the SAW resonator 52D is disposed on the parallel arm which branches off from the second branch node of the series arm. Each of the SAW resonators 52A through 52D may include a plurality of series-connected divided resonators.

Figure 6:
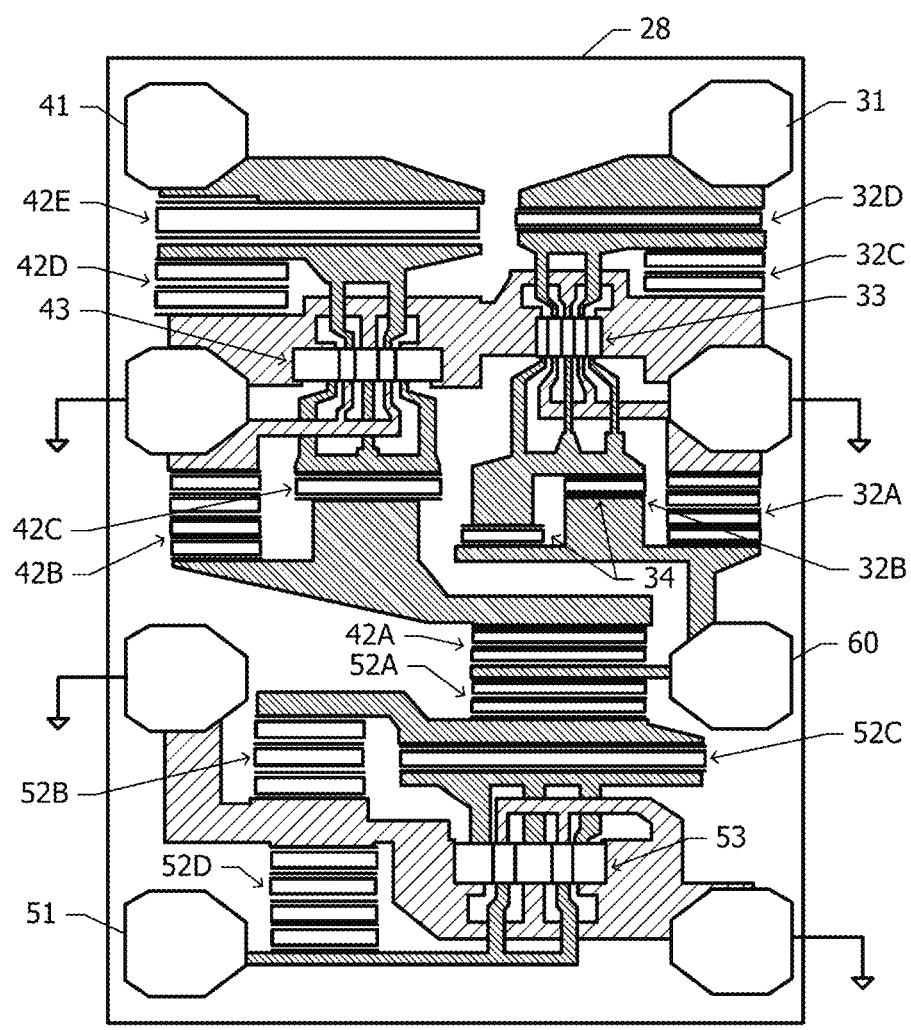
FIG. 6 illustrates the arrangement of SAW resonators, longitudinally coupled SAW filters, wires, terminals, and other components included in the filter device of the second preferred embodiment of the present invention as viewed from above.

FIG. 6 illustrates the arrangement of the SAW resonators, the longitudinally coupled SAW filters, wires, terminals, and other components included in the filter device 20 of the second preferred embodiment as viewed from above. On the surface of a substrate 28 made of a piezoelectric material, the common terminal 60, the first through third individual terminals 31, 41, and 51, multiple ground terminals, multiple SAW resonators, multiple longitudinally coupled SAW filters, wires and other components are disposed. As the substrate 28, a single crystal substrate made of a piezoelectric material, such as LiTaO$_3$ or LiNbO$_3$, for example, may preferably be used.

In FIG. 6, ground wires are indicated by the sparse hatched portion, while series arm wires are indicated by the dense hatched portion. An insulating film is disposed where two wires cross each other so as to provide electrical insulation therebetween. The SAW resonators, the longitudinally coupled SAW filters, and terminals are designated by the same reference numerals provided to those in the equivalent circuit diagram shown in FIG. 5. The IDTs of two divided resonators 34 of the SAW resonator 32B are arranged in the configuration shown in FIG. 4B.

The filter device 20 of the second preferred embodiment preferably has a length of about 1.8 mm, a width of about 1.4 mm, and a height of about 0.6 mm, for example. The filter device 20 is mounted on a package substrate with its top side facing downward.

Advantages of the second preferred embodiment will be explained below with reference to FIGS. 8A through 10B in comparison with a filter device 20 of a comparative example shown in FIG. 7.

Figure 7:
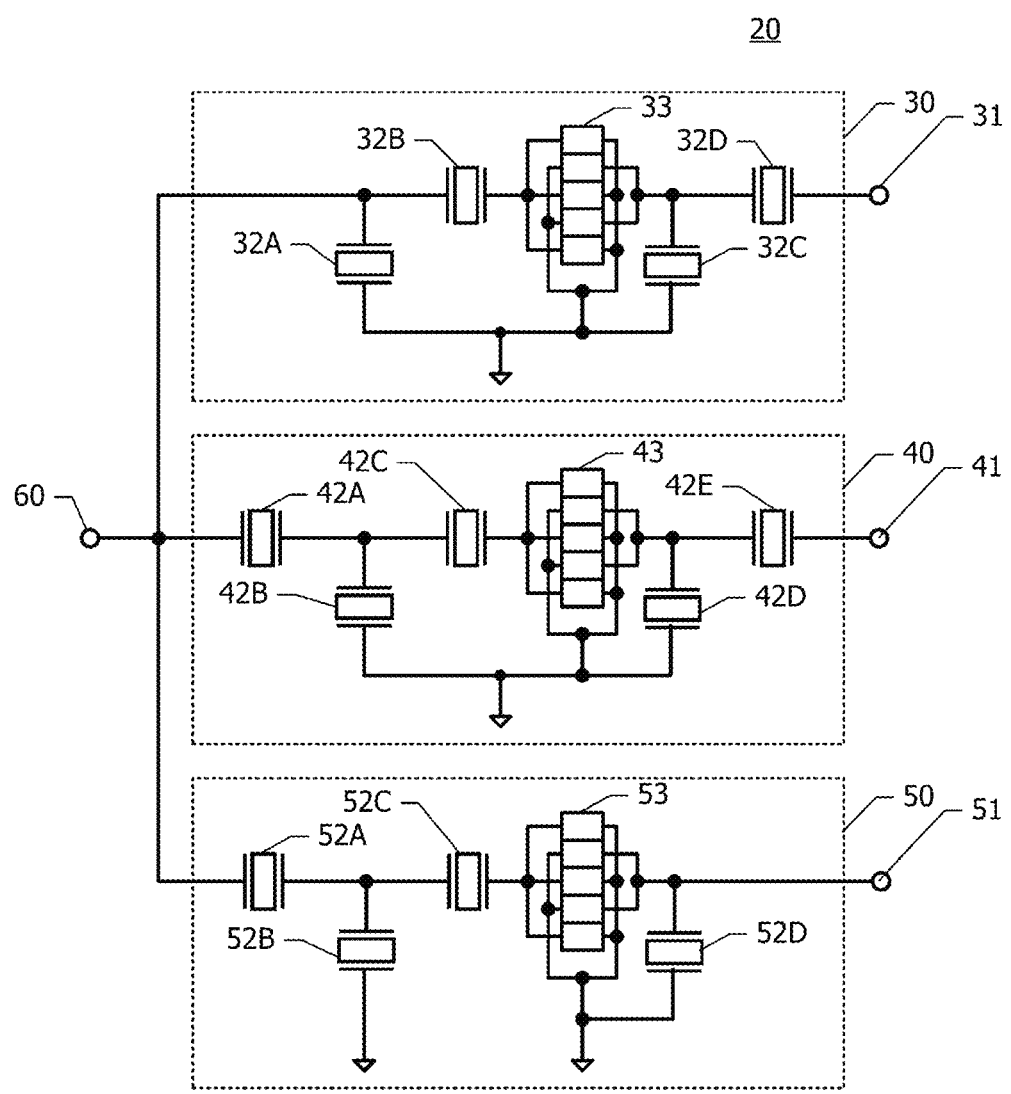
FIG. 7 is an equivalent circuit diagram of a filter device according to a comparative example.

FIG. 7 is an equivalent circuit diagram of the filter device 20 according to the comparative example. In the comparative example, the SAW resonator 32B of the filter device 20 of the second preferred embodiment is replaced by a single SAW resonator 32B. The other elements of the comparative example are the same or substantially the same as those of the second preferred embodiment. The filter device 20 of the second preferred embodiment (FIG. 5) and the filter device 20 of the comparative example (FIG. 7) were prepared and the bandpass characteristics of the two filter devices 20 were measured.

The characteristics of the SAW resonators and the longitudinally coupled SAW filters of the filter device 20 of the comparative example were determined so that the pass bands of the first, second, and third bandpass filters 30, 40, and 50 of the comparative example would match or substantially match Band 41, Band 66, and Band 3 downlink frequency bands, respectively. The IDT pitch of the SAW resonator 32B (FIG. 7) of the comparative example was first determined. Then, based on the IDT pitch of the SAW resonator 32B of the comparative example, the IDT pitches of the two divided resonators 34 of the SAW resonator 32B (FIG. 5) of the second preferred embodiment were determined. More specifically, the IDT pitch of one divided resonator 34 was set to be the same or substantially the same as that of the SAW resonator 32B of the comparative example. The IDT pitch of the other divided resonator 34 was set to be slightly smaller than that in the comparative example. The difference in the IDT pitch between the two divided resonators 34 was set to be about 0.06% of the average of the IDT pitches of the two divided resonators 34.

Figure 8A:
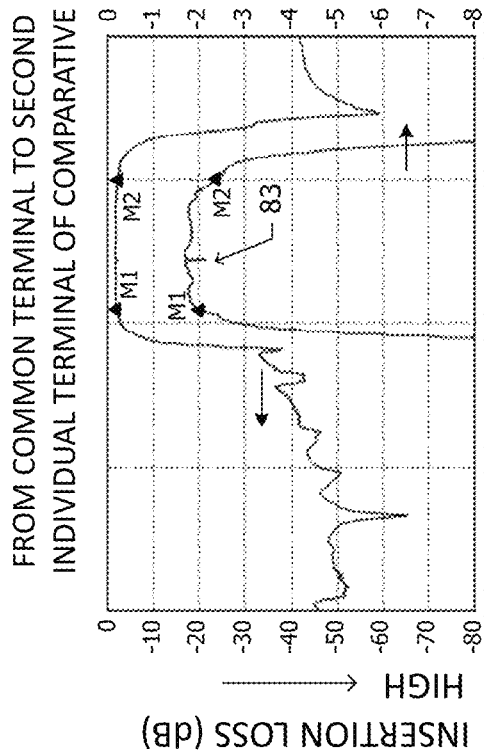
FIGS. 8A and 8B are graphs illustrating the measurement results of the bandpass characteristics in the path from a common terminal to a second individual terminal in the filter device of the second preferred embodiment of the present invention shown in FIG. 5.
Figure 8B:
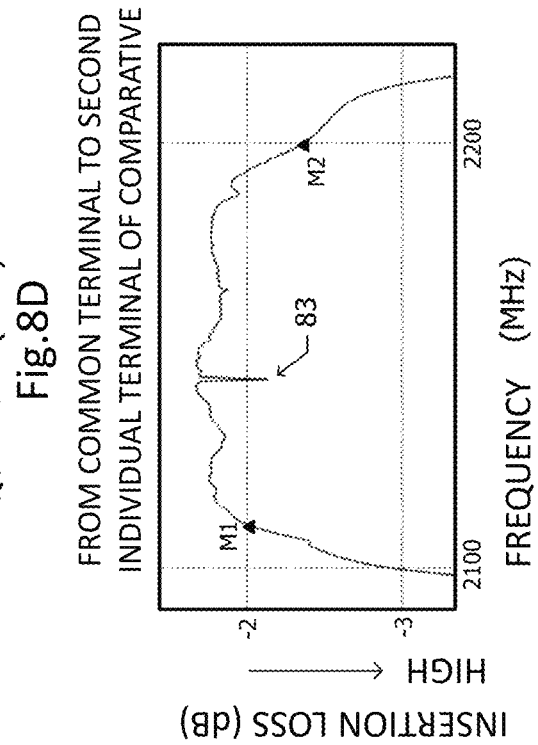
Figure 8C:
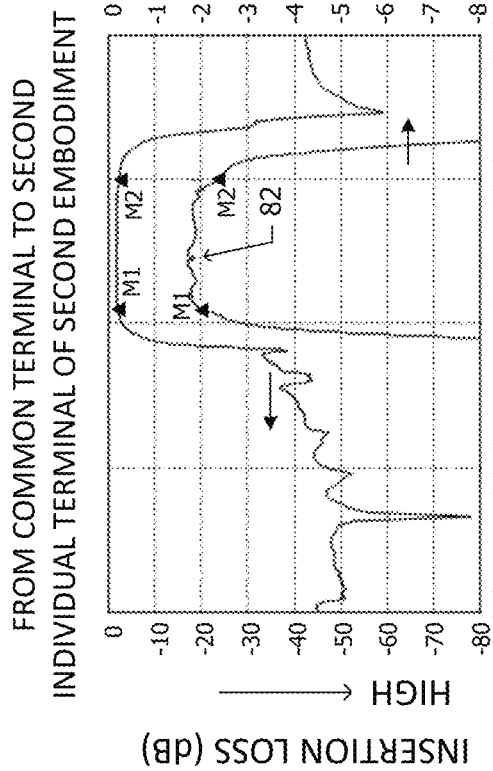
FIGS. 8C and 8D are graphs illustrating the measurement results of the bandpass characteristics in the path from a common terminal to a second individual terminal in the filter device of the comparative example shown in FIG. 7.
Figure 8D:
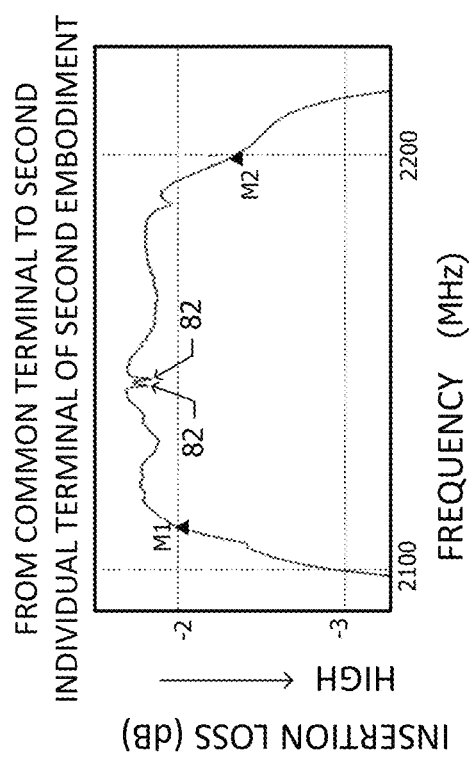

FIGS. 8A and 8B are graphs illustrating the measurement results of the bandpass characteristics in the path from the common terminal 60 to the second individual terminal 41 in the filter device 20 of the second preferred embodiment (FIG. 5). FIGS. 8C and 8D are graphs illustrating the measurement results of the bandpass characteristics in the path from the common terminal 60 to the second individual terminal 41 in the filter device 20 of the comparative example (FIG. 7). In the graphs, the horizontal axis indicates the frequency (MHz), while the vertical axis indicates the insertion loss (dB). In FIGS. 8A and 8C, the scale factor of the vertical axis on the right side is ten times as large as that on the left side. The insertion loss increases downward on the vertical axis. A network analyzer is usually used for measuring the bandpass characteristics.

FIG. 8B is an enlarged graph showing a specific frequency range in the graph of FIG. 8A. FIG. 8D is an enlarged graph showing a specific frequency range in the graph of FIG. 8C. Markers M1 and M2 in the graphs correspond to the frequencies at about 2110 MHz and about 2200 MHz, respectively. The frequency band between the markers M1 and M2 is equal or substantially equal to Band 66 downlink frequency band used for the second bandpass filter 40.

As shown in FIGS. 8C and 8D, in the filter device 20 of the comparative example (FIG. 7), a single large ripple 83 is observed at the frequency of about 2145 MHz. In contrast, in the filter device 20 of the second preferred embodiment (FIG. 5), two ripples 82 are observed at the frequencies of about 2145 MHz and about 2146.2 MHz. An increase in the insertion loss of each of the two ripples 82 is smaller than that of the ripple 83 in the bandpass characteristics (FIGS. 8C and 8D) of the filter device 20 of the comparative example.

Figure 9:
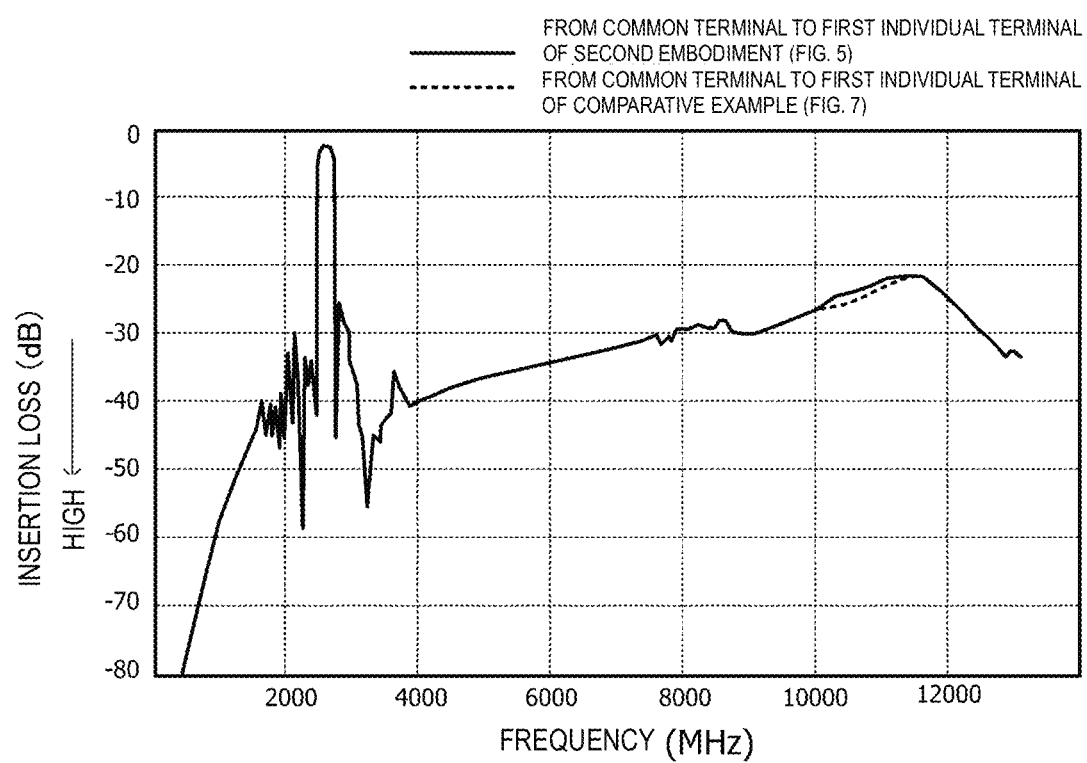
FIG. 9 is a graph illustrating the measurement results of the bandpass characteristics in the path from the common terminal to a first individual terminal in the filter device of the second preferred embodiment of the present invention shown in FIG. 5 and those of the filter device of the comparative example shown in FIG. 7.
Figure 10A:
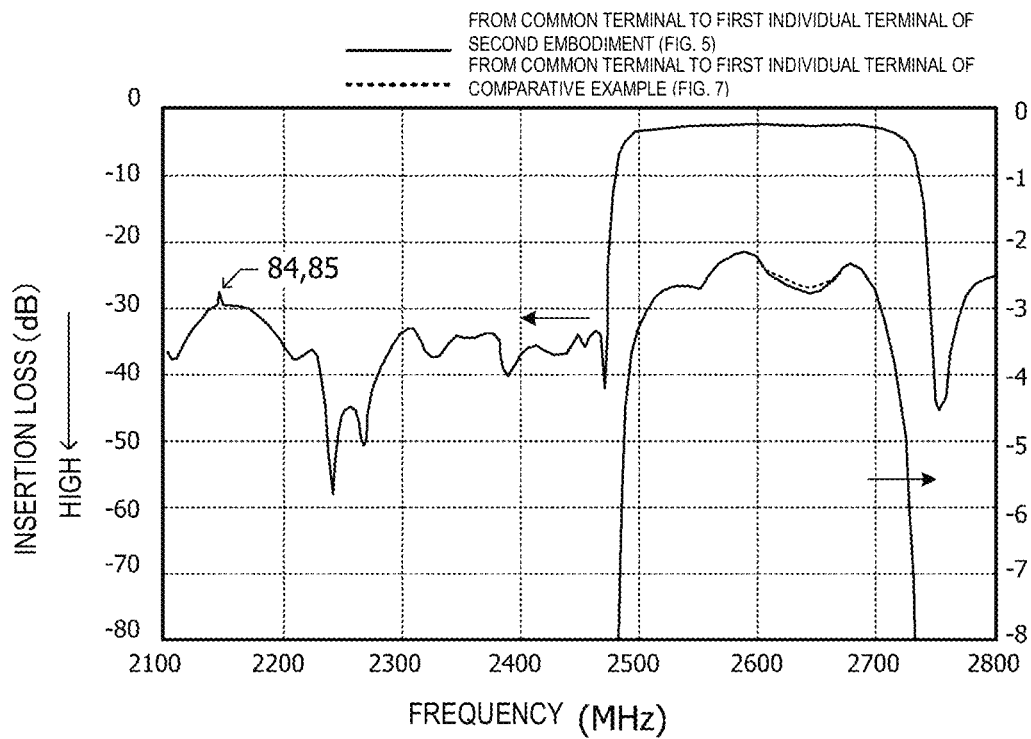
FIG. 10A is an enlarged graph showing a specific frequency range in the graph of FIG. 9.
Figure 10B:
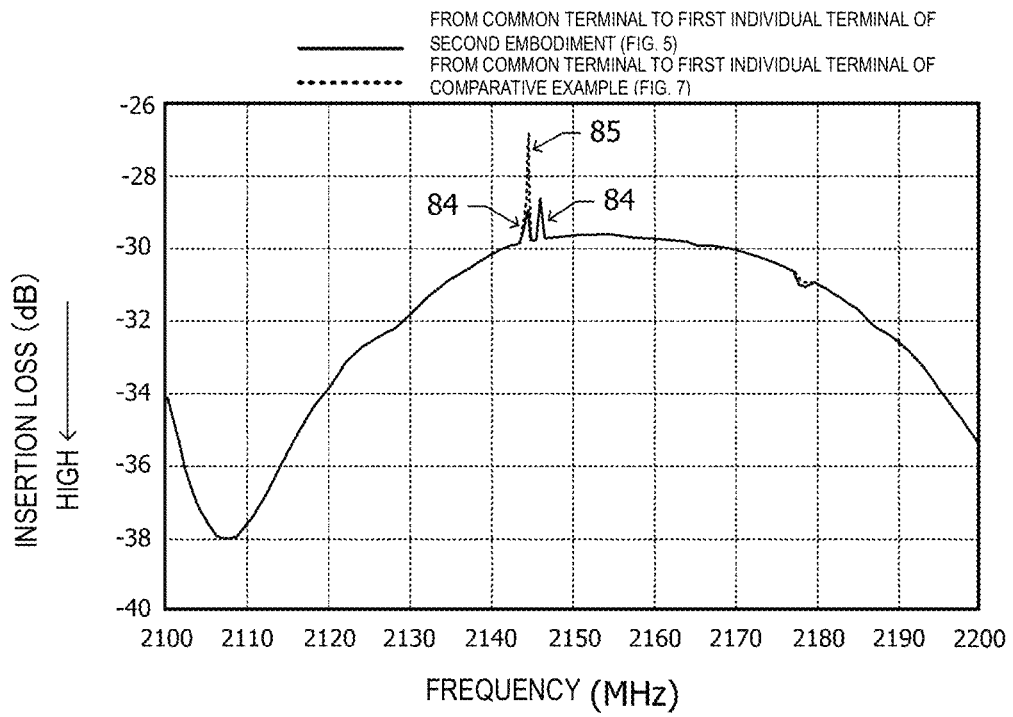
FIG. 10B is an enlarged graph showing a specific frequency range in the graph of FIG. 10A.

FIGS. 9, 10A, and 10B are graphs illustrating the measurement results of the bandpass characteristics in the path from the common terminal 60 to the first individual terminal 31 in the filter device 20 of the second preferred embodiment (FIG. 5) and those of the filter device 20 of the comparative example (FIG. 7). In the graphs, the horizontal axis indicates the frequency (MHz), while the vertical axis indicates the insertion loss (dB). The insertion loss increases downward on the vertical axis. In the graphs, the solid line indicates the bandpass characteristics of the filter device 20 of the second preferred embodiment (FIG. 5), while the broken line indicates the bandpass characteristics of the filter device 20 of the comparative example (FIG. 7).

FIG. 10A is an enlarged graph showing a specific frequency range in the graph of FIG. 9. In FIG. 10A, the scale factor of the vertical axis on the right side is ten times as large as that on the left side. FIG. 10B is an enlarged graph showing a specific frequency range in the graph of FIG. 10A.

As shown in FIGS. 9 and 10A, almost no difference is observed between the insertion loss in the pass band of the first bandpass filter 30 of the second preferred embodiment and that of the comparative example. FIG. 10B shows that, in the second preferred embodiment, two ripples 84 occur at the frequencies of about 2145 MHz and about 2146.2 MHz, while, in the comparative example, a single large ripple 85 occurs at the frequency of about 2145 MHz. The two ripples 84 in the second preferred embodiment are due to the unwanted waves produced in the two divided resonators 34 (FIG. 5). The large ripple 85 in the comparative example is due to the unwanted waves produced in the SAW resonator 32B (FIG. 7).

The ripples 82 (FIGS. 8A and 8B) observed in the pass band of the second bandpass filter 40 of the second preferred embodiment are caused by the ripples 84 (FIGS. 10A and 10B) outside the pass band of the first bandpass filter 30. The ripple 83 (FIGS. 8C and 8D) observed in the pass band of the second bandpass filter 40 of the comparative example is caused by the ripple 85 (FIGS. 10A and 10B) outside the pass band of the first bandpass filter 30. Focusing only on the first bandpass filter 30, the ripple 85 outside the pass band of the first bandpass filter 30 of the comparative example does not significantly influence the bandpass characteristics of the first bandpass filter 30. Nevertheless, if the frequency of the ripple 85 is included in the pass band of the second bandpass filter 40, the ripple 85 significantly influences the bandpass characteristics of the second bandpass filter 40, as shown in FIG. 8D.

In the second preferred embodiment, a drop in the insertion loss caused by the ripples 84 (FIG. 10B) outside the pass band of the first bandpass filter 30 is small. This contributes to regulating an increase in the insertion loss caused by the ripples 82 (FIG. 8B) in the pass band of the second bandpass filter 40. It is thus possible to lessen the influence of the ripples 84 on the bandpass characteristics of the second bandpass filter 40.

As shown in FIGS. 9 and 10A, even when the SAW resonator 32B includes the two divided resonators 34 (FIG. 5), the resulting bandpass characteristics are the same or almost the same as those obtained when the single SAW resonator 32B (FIG. 7) is used as in the comparative example. The result of designing the filter device 20 of the comparative example (FIG. 7) can thus be utilized to design the filter device 20 of the second preferred embodiment (FIG. 5).

The preferable range of the difference in the IDT pitch between the two divided resonators 34 (FIG. 5) used in the filter device 20 of the second preferred embodiment will be discussed below with reference to FIG. 11. The IDT pitch of one divided resonator 34 was fixed to be the same or substantially the same IDT pitch of the SAW resonator 32B in the comparative example, while the IDT pitch of the other divided resonator 34 was varied. Then, the bandpass characteristics were determined by simulations.

Figure 11:
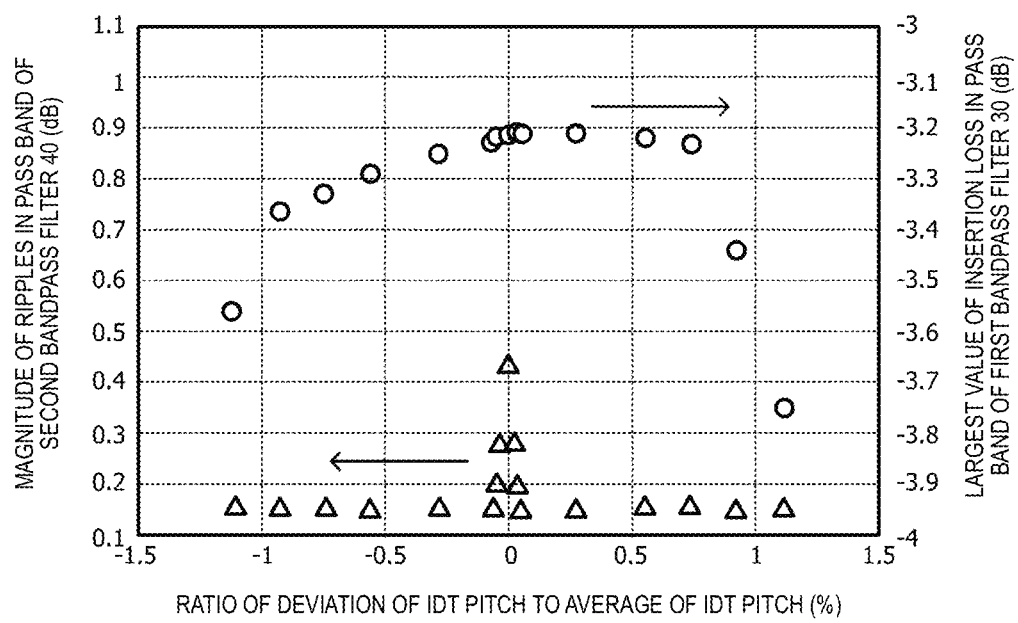
FIG. 11 is a graph illustrating the simulation results of the bandpass characteristics obtained while the IDT pitch of one divided resonator of the filter device of the second preferred embodiment of the present invention is fixed and the IDT pitch of the other divided resonator is varied.

FIG. 11 is a graph illustrating the simulation results. The value of the fixed IDT pitch of one divided resonator 34 is indicated by Pf, while the value of the varied IDT pitch of the other divided resonator 34 is indicated by Pv. The horizontal axis of FIG. 11 represents the result of (Pv−Pf)/((Pv+Pf)/2) (%). That is, the horizontal axis of FIG. 11 represents the ratio of the deviation of the IDT pitch to the average of the IDT pitch. The deviation of the IDT pitch is assumed to be positive when Pv>Pf and to be negative when Pv<Pf. The absolute value of the deviation of the IDT pitch will be called the pitch difference.

The vertical axis on the left side in FIG. 11 represents an increase in the insertion loss (dB) caused by the ripples 82 (may also be called the magnitude of ripples 82) observed in the pass band of the second bandpass filter 40 (FIG. 8B). The vertical axis on the right side of FIG. 11 represents the largest value of the insertion loss (dB) in the pass band of the first bandpass filter 30. The insertion loss increases downward on the vertical axis on the right side. In FIG. 11, the triangles indicate the magnitude of the ripples 82 in the pass band of the second bandpass filter 40, while the circles indicate the largest value of the insertion loss in the pass band of the first bandpass filter 30.

The state of the origin of the horizontal axis in FIG. 11 corresponds to the configuration of the filter device 20 of the comparative example (FIG. 7). The magnitude of the ripples 82 observed in the bandpass characteristics of the second bandpass filter 40 has the largest value when the ratio of the pitch difference to the average of the IDT pitch is zero. This corresponds to the state in which the single large ripple 83 occurs in the pass band of the second bandpass filter 40 in the comparative example, as shown in FIG. 8D.

As the ratio of the pitch difference to the average of the IDT pitch becomes greater to the value not more than about 0.02%, the magnitude of the ripples 82 gradually becomes smaller. This corresponds to the state in which the two ripples 82 shown in FIG. 8B partially overlap each other. When the ratio of the pitch difference to the average of the IDT pitch is about 0.02% or greater, the magnitude of the ripples 82 is constant or substantially constant. This corresponds to the state in which the two ripples 82 shown in FIG. 8B are clearly separated from each other. It is thus preferable that the ratio of the pitch difference to the average of the IDT pitch is, for example, about 0.02% or greater in order to sufficiently provide the advantageous effect of decreasing the magnitude of the ripples 82 in the pass band of the second bandpass filter 40.

As the ratio of the pitch difference to the average of the IDT pitch increases from zero, the insertion loss in the pass band of the first bandpass filter 30 becomes greater. Especially when the ratio of the pitch difference to the average of the IDT pitch exceeds about 0.7%, the insertion loss rises sharply. It is thus preferable that the ratio of the pitch difference to the average of the IDT pitch is, for example, about 0.7% or smaller. This can regulate an increase in the insertion loss in the pass band caused by the two divided resonators 34 defining the SAW resonator 32B (FIG. 5).

The relationship between the pass band of the first bandpass filter 30 and that of the second bandpass filter 40 will be discussed below with reference to FIG. 12.

Figure 12:
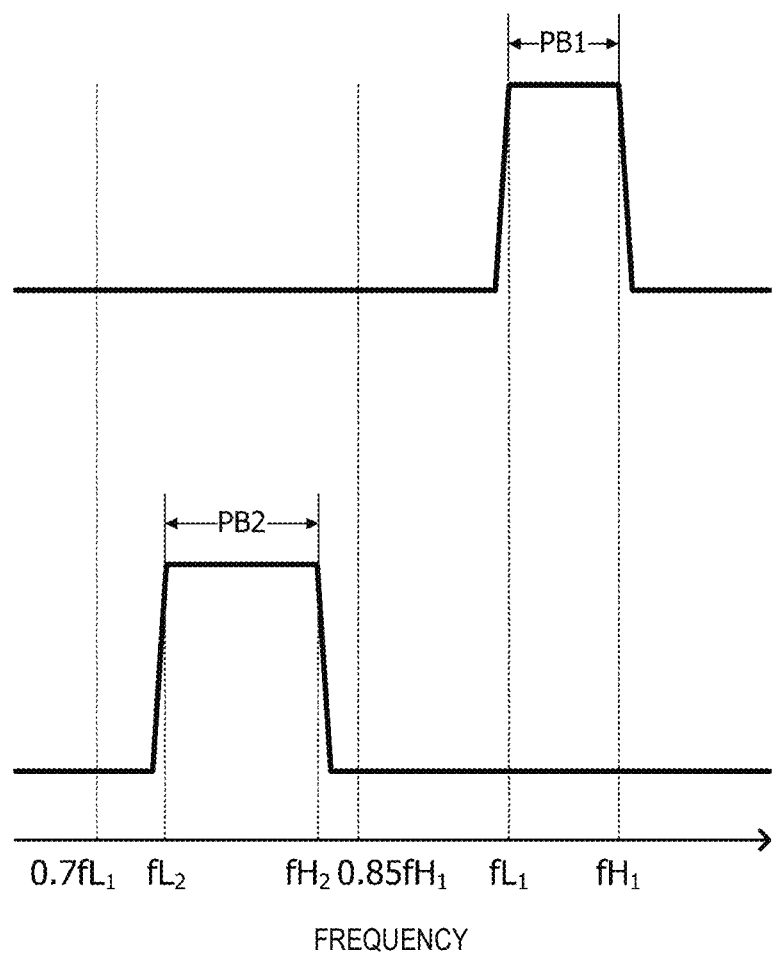
FIG. 12 is a graph illustrating the relationship between the pass band of a first bandpass filter and that of a second bandpass filter in the filter device of the second preferred embodiment of the present invention on the frequency axis.

FIG. 12 is a graph illustrating the relationship between the pass band PB1 of the first bandpass filter 30 and the pass band PB2 of the second bandpass filter 40 on the frequency axis. The lower cutoff frequency and the higher cutoff frequency of the pass band PB1 of the first bandpass filter 30 are indicated by $fL_1$ and $fH_1$, respectively. The lower cutoff frequency and the higher cutoff frequency of the pass band PB2 of the second bandpass filter 40 are indicated by $fL_2$ and $fH_2$, respectively. The higher cutoff frequency $fH_2$ of the pass band PB2 of the second bandpass filter 40 is lower than the lower cutoff frequency $fL_1$ of the pass band PB1 of the first bandpass filter 30.

Typically, a Rayleigh response of a SAW resonator occurs in the frequency range which is about 0.7 to about 0.85 times as high as the resonant frequency of the SAW resonator. That is, if the frequency range which is about 0.7 to about 0.85 times as high as the resonant frequency of a SAW resonator of the first bandpass filter 30 overlaps the pass band PB2 of the second bandpass filter 40, a Rayleigh response due to the first bandpass filter 30 is likely to occur in the pass band PB2 of the second bandpass filter 40.

In the example in FIG. 12, the pass band PB2 of the second bandpass filter 40 is included in the frequency range of about 0.7 $fL_1$ to about 0.85 $fH_1$. When the pass band PB1 of the first bandpass filter 30 and the pass band PB2 of the second bandpass filter 40 have such a relationship, ripples 82 (FIG. 8B) are likely to occur in the pass band PB2 of the second bandpass filter 40.

In addition to when the pass band PB2 is included in the frequency range of about 0.7 $fL_1$ to about 0.85 $fH_1$, when the frequency range of about 0.7 $fL_1$ to about 0.85 $fH_1$ is included in the pass band PB2 of the second bandpass filter 40 or when a portion of the frequency range of about 0.7 $fL_1$ to about 0.85 $fH_1$ overlaps a portion of the pass band PB2 of the second bandpass filter 40, ripples 82 (FIG. 8B) are also likely to occur in the pass band PB2 of the second bandpass filter 40.

When the pass band PB1 of the first bandpass filter 30 and the pass band PB2 of the second bandpass filter 40 have one of the above-described relationships, it is particularly preferable that a filter device is configured as in the filter device 20 of the second preferred embodiment.

Figure 13A:
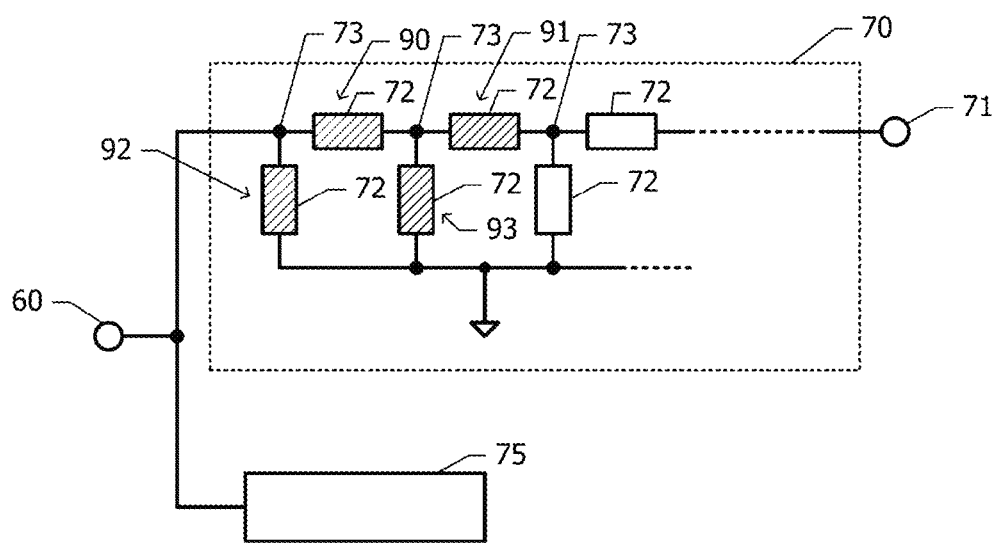
FIG. 13A is a circuit diagram of a ladder bandpass filter configured similarly to the first bandpass filter of the filter device of the second preferred embodiment of the present invention.
Figure 13B:
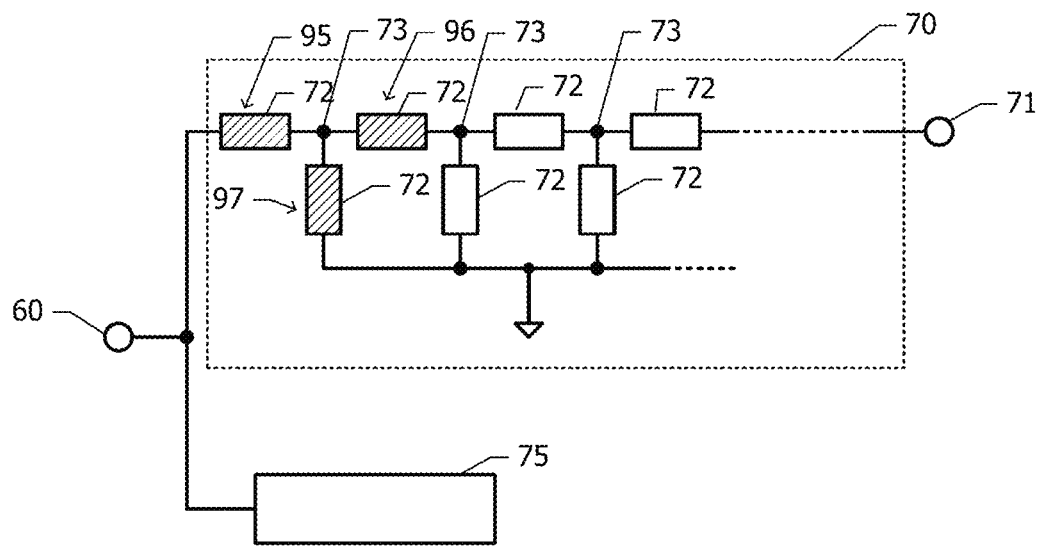
FIG. 13B is a circuit diagram of a ladder bandpass filter configured differently from that in FIG. 13A.

A description will be provided, with reference to FIGS. 13A and 13B, in which a SAW resonator of the first bandpass filter 30 includes two divided resonators 34 in order to maximize the above-described advantages.

FIG. 13A is a circuit diagram of a ladder bandpass filter configured similarly to the first bandpass filter 30. The bandpass filter 70 and another bandpass filter 75 are connected to a common terminal 60.

A series arm connects the common terminal 60 and an individual terminal 71 of the bandpass filter 70. A parallel arm is connected between a ground and each of a plurality of branch nodes 73 of the series arm. No SAW resonator is connected between the common terminal 60 and the first branch node 73 as seen from the common terminal 60. That is, the SAW resonator 72 on the series arm and the SAW resonator 72 on the parallel arm are both connected directly to the common terminal 60.

If resonance due to unwanted waves is produced in any one of the SAW resonators 72 of the bandpass filter 70, it influences the other bandpass filter 75 via the common terminal 60. In this case, even when resonance due to unwanted waves is produced in a SAW resonator 72 separated farther from the common terminal 60, many other SAW resonators 72 intervene between this SAW resonator 72 and the bandpass filter 75, thus weakening the resonance as it is transmitted to the bandpass filter 75 via the common terminal 60. In contrast, if unwanted resonance is produced in a SAW resonator 72 positioned close to the common terminal 60, it is more easily transmitted to the bandpass filter 75. From this point of view, it is appropriate that a SAW resonator 72 positioned close to the common terminal 60 includes two divided resonators, thus maximizing the advantageous effect of reducing ripples caused by unwanted resonance.

As an example, in the direction from the common terminal 60 to the first individual terminal 71, at least one of the SAW resonator 72 disposed on a series arm portion 90 between the first and second branch nodes 73, the SAW resonator 72 disposed on a series arm portion 91 between the second and third branch nodes 73, the SAW resonator 72 disposed on a parallel arm 92 which branches off from the first branch node 73, and the SAW resonator 72 disposed on a parallel arm 93 which branches off from the second branch node 73 (these SAW resonators 72 are indicated by the hatched portions in FIG. 13A) includes two parallel-connected divided resonators.

FIG. 13B is a circuit diagram of a ladder bandpass filter 70 configured differently from that in FIG. 13A. A SAW resonator 72 is connected between the common terminal 60 and the first branch node 73 as seen from the common terminal 60. In this configuration, in the direction from the common terminal 60 to the first individual terminal 71, at least one of the SAW resonator 72 disposed on a series arm portion 95 between the common terminal 60 and the first branch node 73, the SAW resonator 72 disposed on a series arm portion 96 between the first and second branch nodes 73, and the SAW resonator 72 disposed on a parallel arm 97 which branches off from the first branch node 73 (these SAW resonators 72 are indicated by the hatched portions in FIG. 13B) includes two parallel-connected divided resonators.

A modified example of the second preferred embodiment will be described below. Instead of the second bandpass filter 40 (FIG. 5) of the second preferred embodiment, a low pass filter or a band elimination filter may be used. In this modification, advantages similar to those of the second preferred embodiment can be obtained. That is, although ripples caused by the divided resonators 34 of the first bandpass filter 30 occur in the pass band of the low pass filter or the band elimination filter, an increase in the insertion loss caused by the ripples can be regulated.

Third Preferred Embodiment

A filter device according to a third preferred embodiment of the present invention will be described below with reference to FIGS. 14 through 15D. An explanation of the elements configured similarly to those of the filter device 20 (FIGS. 5 and 6) of the second preferred embodiment will be omitted.

Figure 14:
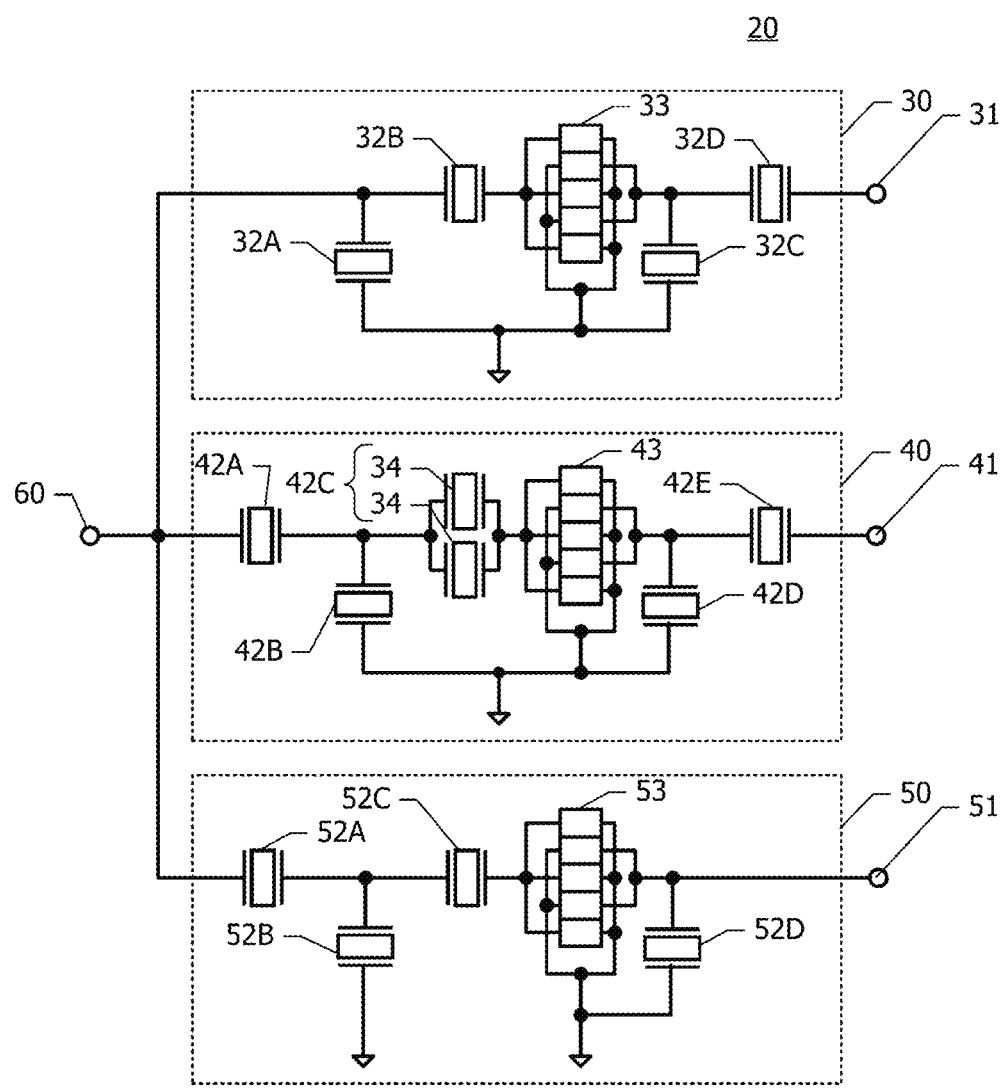
FIG. 14 is an equivalent circuit diagram of a filter device according to a third preferred embodiment of the present invention.

FIG. 14 is an equivalent circuit diagram of a filter device 20 according to the third preferred embodiment. In the second preferred embodiment, the SAW resonator 32B of the first bandpass filter 30 includes two divided resonators 34. In the third preferred embodiment, a SAW resonator 42C of the second bandpass filter 40 includes two divided resonators 34. The SAW resonator 32B of the first bandpass filter 30 includes the single SAW resonator.

FIGS. 15A and 15B are graphs illustrating the measurement results of the bandpass characteristics in the path from the common terminal 60 to the second individual terminal 41 in the filter device 20 of the third preferred embodiment (FIG. 14). FIGS. 15C and 15D are graphs illustrating the measurement results of the bandpass characteristics in the path from the common terminal 60 to the second individual terminal 41 in the filter device 20 of the comparative example (FIG. 7). The bandpass characteristics of the comparative example shown in FIGS. 15C and 15D are the same or substantially the same bandpass characteristics shown in FIGS. 8C and 8D. However, the frequency ranges on the horizontal axis of the bandpass characteristics in FIGS. 15C and 15D are different from those in FIGS. 8C and 8D.

In the graphs in FIGS. 15A through 15D, the horizontal axis indicates the frequency (MHz), while the vertical axis indicates the insertion loss (dB). In FIGS. 15A and 15C, the scale factor of the vertical axis on the right side is ten times as large as that on the left side. The insertion loss increases downward on the vertical axis. FIG. 15B is an enlarged graph showing a specific frequency range in the graph of FIG. 15A. FIG. 15D is an enlarged graph showing a specific frequency range in the graph of FIG. 15C. Markers M1 and M2 in the graphs correspond to the frequencies at about 2110 MHz and about 2200 MHz, respectively.

Two ripples 86 (FIGS. 15A and 15B) are observed in the bandpass characteristics of the filter device 20 of the third preferred embodiment. In the comparative example, a single ripple 87 (FIGS. 15C and 15D) is observed in the bandpass characteristics of the filter device 20. The ripples 86 and 87, which are observed at the frequency of about 1677 MHz, are due to unwanted waves produced in the SAW resonator 42C of the second bandpass filter 40.

Advantages of the third preferred embodiment will be described below. A drop in the insertion loss caused by a ripple will be measured by the height of the ripple. The heights of the two ripples 86 in the third preferred embodiment are lower than that of the ripple 87 in the comparative example. The reason why the heights of the ripples 86 are lower than that of the ripple 87 is that the SAW resonator 42C of the second bandpass filter 40 includes two divided resonators 34. Lower heights of the ripples 86 can lessen the influence of the ripples 86 on the bandpass characteristics in the path from the common terminal 60 to the second individual terminal 41.

A modified example of the third preferred embodiment will be described below. In the third preferred embodiment, the SAW resonator 42C of the second bandpass filter 40 includes two divided resonators 34. Alternatively, another SAW resonator of the second bandpass filter 40 may include two divided resonators. At least one SAW resonator of the third bandpass filter 50 may include two divided resonators.

Fourth Preferred Embodiment

A communication apparatus according to a fourth preferred embodiment of the present invention will be described below with reference to FIG. 16. The filter device 20 of the second preferred embodiment is used in the communication apparatus of the fourth preferred embodiment. An explanation of the elements configured similarly to those of the filter device 20 of the second preferred embodiment (FIGS. 5 and 6) will be omitted.

Figure 16:
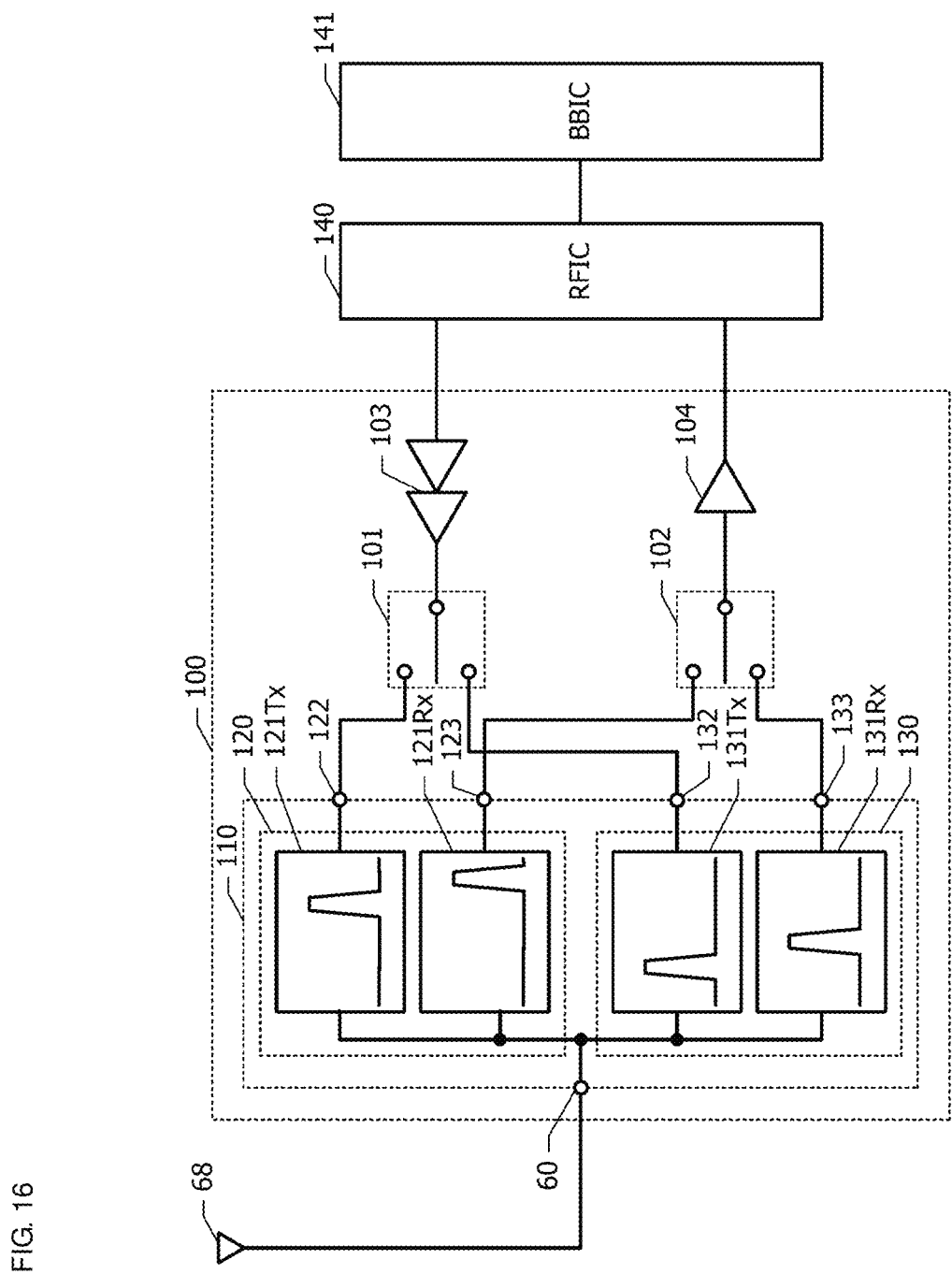
FIG. 16 is a block diagram of a communication apparatus according to a fourth preferred embodiment of the present invention.

FIG. 16 is a block diagram of the communication apparatus according to the fourth preferred embodiment. The communication apparatus includes a radio-frequency (RF) front-end circuit 100, a radio-frequency (RF) signal processing circuit (radio-frequency integrated circuit (RFIC)) 140, a baseband signal processing circuit (baseband integrated circuit (BBIC)) 141, and an antenna 68. The RF front-end circuit 100 includes a quadplexer 110, a transmit switch 101, a receive switch 102, a power amplifier 103, and a low-noise amplifier 104. The quadplexer 110 includes two duplexers 120 and 130. The duplexer 120 includes a transmit bandpass filter 121Tx and a receive bandpass filter 121Rx. The duplexer 130 includes a transmit bandpass filter 131Tx and a receive bandpass filter 131Rx.

The duplexer 120 is a Band 41 transmit/receive duplexer, while the duplexer 130 is a Band 66 transmit/receive duplexer, for example. The transmit bandpass filter 121Tx is disposed between a common terminal 60 and an individual terminal 122. The receive bandpass filter 121Rx is disposed between the common terminal 60 and an individual terminal 123. The transmit bandpass filter 131Tx is disposed between the common terminal 60 and an individual terminal 132. The receive bandpass filter 131Rx is disposed between the common terminal 60 and an individual terminal 133. As these bandpass filters, SAW filters are used. The antenna 68 is connected to the common terminal 60.

A transmit RF signal output from the power amplifier 103 is input into one of the individual terminals 122 and 132 via the transmit switch 101. The transmit RF signal passes through the corresponding one of the transmit bandpass filters 121Tx and 131Tx and is sent from the antenna 68. A received RF signal received by the antenna 68 passes through one of the receive bandpass filters 121Rx and 131Rx and is input into the low-noise amplifier 104 via the receive switch 102.

The RF signal processing circuit 140 converts a received RF signal output from the low-noise amplifier 104 into a lower frequency signal and outputs it to the baseband signal processing circuit 141. The RF signal processing circuit 140 converts a transmit RF signal input from the baseband signal processing circuit 141 into a higher frequency signal and outputs it to the power amplifier 103. The baseband signal processing circuit 141 performs various signal processing operations on a baseband signal.

Advantages of the fourth preferred embodiment will be explained below.

The receive bandpass filter 121Rx corresponds to the first bandpass filter 30 of the filter device 20 of the second preferred embodiment (FIG. 5), while the receive bandpass filter 131Rx corresponds to the second bandpass filter 40 of the filter device 20 (FIG. 5). The receive bandpass filter 121Rx is configured as in the first bandpass filter 30. Thus, the bandpass characteristics of the receive bandpass filter 131Rx are less likely to be influenced by unwanted resonance produced in the receive bandpass filter 121Rx.

As described above, unwanted resonance produced in a bandpass filter of one duplexer, such as the receive bandpass filter 121Rx of the duplexer 120, may influence the bandpass characteristics of a bandpass filter of another duplexer, such as the receive bandpass filter 131Rx of the duplexer 130. Unwanted resonance produced in a bandpass filter of a duplexer, such as the receive bandpass filter 121Rx of the duplexer 120, may also influence the bandpass characteristics of another bandpass filter of the same duplexer, such as the transmit bandpass filter 121Tx of the duplexer 120. In this manner, when multiple bandpass filters are connected to the common terminal 60, unwanted resonance produced in one bandpass filter may adversely influence the bandpass characteristics of another bandpass filter. Even in this case, the influence of the unwanted resonance can be lessened as a result of defining at least one SAW resonator in the bandpass filter having produced the unwanted resonance by multiple divided resonators.

Fifth Preferred Embodiment

A filter device according to a fifth preferred embodiment of the present invention will be described below with reference to FIG. 17A. An explanation of the elements configured similarly to those of the filter device 20 of the first preferred embodiment (FIG. 1) and those of the second preferred embodiment (FIG. 5) will be omitted. While the filter device 20 according to the first preferred embodiment (FIG. 1) is a bandpass filter, a filter device 20 according to the fifth preferred embodiment is a low pass filter.

Figure 17A:
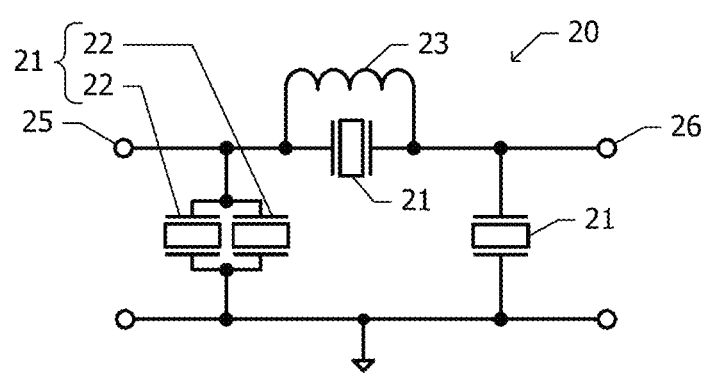
FIG. 17A is an equivalent circuit diagram of a filter device according to a fifth preferred embodiment of the present invention.

FIG. 17A is an equivalent circuit diagram of the filter device 20 according to the fifth preferred embodiment. The filter device 20 of the fifth preferred embodiment is preferably, for example, a π-type filter. An inductor 23 is connected in parallel with the SAW resonator 21 which connects the first terminal 25 and the second terminal 26. A SAW resonator 21 is connected between the first terminal 25 and a ground, while another SAW resonator 21 is connected between the second terminal 26 and a ground. The SAW resonator 21 connected between the first terminal 25 and a ground includes two parallel-connected divided resonators 22. As in the first preferred embodiment, the IDT pitch of one divided resonator 22 and that of the other divided resonator 22 are different from each other.

Advantages of the fifth preferred embodiment will be explained below. As in the first preferred embodiment, a drop in the insertion loss caused by ripples due to unwanted waves is regulated. Instead of the first bandpass filter 30 of the filter device 20 of the second preferred embodiment (FIG. 5), the low pass filter of the fifth preferred embodiment may be used. In this case, it is possible to lessen the influence of ripples caused by the low pass filter on the bandpass characteristics of the second bandpass filter 40 or the third bandpass filter 50.

A modified example of the fifth preferred embodiment will be described below with reference to FIG. 17B.

Figure 17B:
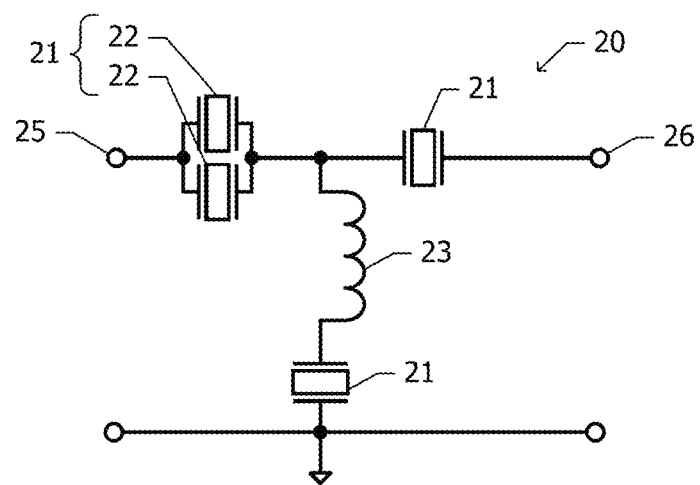
FIG. 17B is an equivalent circuit diagram of a filter device according to a modified example of the fifth preferred embodiment of the present invention.

FIG. 17B is an equivalent circuit diagram of the filter device 20 according to the modified example of the fifth preferred embodiment. The filter device 20 of the modified example is a high pass filter.

The filter device 20 of the modified example is preferably, for example, a T-type filter. Two SAW resonators 21 are disposed in series with each other between the first and second terminals 25 and 26. An inductor 23 and a SAW resonator 21 are interposed in series with each other between a ground and a node between the above-described two SAW resonators 21. The SAW resonator 21 connected to the first terminal 25 includes two parallel-connected divided resonators 22. As in the first preferred embodiment, the IDT pitch of one divided resonator 22 and that of the other divided resonator 22 are different from each other.

As in the modified example, a SAW resonator 21 included in a high pass filter may include two divided resonators 22. In the modified example, as well as in the fifth preferred embodiment, the influence of ripples caused by the high pass filter on the bandpass characteristics of a bandpass filter can be reduced. As in the example shown in FIG. 3A in the first preferred embodiment, it is possible to regulate a decrease in the attenuation characteristics caused by ripples occurring in the stopband of the high pass filter.

Other modified examples of the fifth preferred embodiment will be discussed below.

In the fifth preferred embodiment (FIG. 17A), the SAW resonator 21 connected between the first terminal 25 and a ground includes two divided resonators 22. Another SAW resonator 21 may include two divided resonators 22. In the above-described modified example (FIG. 17B), the SAW resonator 21 connected to the first terminal 25 includes two divided resonators 22. Another SAW resonator 21 may include two divided resonators 22.

Instead of the first bandpass filter 30 in the second preferred embodiment (FIG. 5), a low pass filter is used in the fifth preferred embodiment (FIG. 17A), and a high pass filter is used in the modified example of the fifth preferred embodiment. Instead of the first bandpass filter 30, a band elimination filter may alternatively be used. In this case, one of multiple SAW resonators included in the band elimination filter includes a plurality of divided resonators.

The present invention is not limited to the above-described preferred embodiments. The configurations described in the different preferred embodiments may partially be replaced by or combined with each other. Similar advantages obtained by similar configurations in the plurality of preferred embodiments are not repeated in the individual preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a common terminal;
   first and second individual terminals;
   a first filter connected between the common terminal and the first individual terminal;
   a second filter connected between the common terminal and the second individual terminal, a pass band of the second filter being in a frequency range lower than a pass band of the first filter; wherein
   the first filter includes a plurality of surface acoustic wave resonators, at least one of the plurality of surface acoustic wave resonators including a plurality of divided resonators connected in parallel with each other, each of the plurality of divided resonators including an interdigital transducer;
   the plurality of divided resonators include at least two divided resonators, and among the at least two divided resonators, a pitch of the interdigital transducer of a divided resonator is different from a pitch of the interdigital transducer of another divided resonator; and
   the interdigital transducers of the plurality of divided resonators are displaced from each other in a direction that is parallel or substantially parallel to an arrangement direction of electrode fingers of at least one of the at least two divided resonators and in a direction perpendicular or substantially perpendicular to the arrangement direction of the electrode fingers.

2. The filter device according to claim 1, wherein at least a portion of a frequency range of a frequency which is about 0.7 times as high as a lower cutoff frequency of the pass band of the first filter to a frequency which is about 0.85 times as high as a higher cutoff frequency of the pass band of the first filter overlaps at least a portion of the pass band of the second filter.

3. The filter device according to claim 2, wherein
the first filter is a ladder filter including a plurality of parallel arms that branch off from a series arm connecting the common terminal and the first individual terminal;
among the plurality of surface acoustic wave resonators, at least one surface acoustic wave resonator is disposed between the common terminal and a first branch node of the series arm at which a parallel arm branches off from the series arm as seen from the common terminal; and
among the plurality of surface acoustic wave resonators, at least one of a surface acoustic wave resonator disposed between the common terminal and the first branch node, a surface acoustic wave resonator disposed between the first branch node and a second branch node at which a parallel arm branches off from the series arm as seen from the common terminal, and a surface acoustic wave resonator disposed on the parallel arm which branches off from the first branch node of the series arm includes the plurality of divided resonators.

4. The filter device according to claim 2, wherein
the first filter is a ladder filter including a plurality of parallel arms that branch off from a series arm connecting the common terminal and the first individual terminal;
none of the plurality of surface acoustic wave resonators are disposed between the common terminal and a first branch node at which a parallel arm branches off from the series arm as seen from the common terminal; and
among the plurality of surface acoustic wave resonators, at least one of a surface acoustic wave resonator disposed between the first branch node and a second branch node at which a parallel arm branches off from the series arm as seen from the common terminal, a surface acoustic wave resonator disposed between the second branch node and a third branch node at which a parallel arm branches off from the series arm as seen from the common terminal, a surface acoustic wave resonator disposed on the parallel arm which branches off from the first branch node of the series arm, and a surface acoustic wave resonator disposed on the parallel arm which branches off from the second branch node of the series arm includes the plurality of divided resonators.

5. The filter device according to claim 2, wherein (Pmax−Pmin)/Pa is about 0.7% or smaller, where Pa is an average of the pitches of the interdigital transducers of the plurality of divided resonators, and Pmax and Pmin are a maximum value and a minimum value, respectively, of the pitches of the interdigital transducers of the plurality of divided resonators.

6. The filter device according to claim 2, wherein
each of the plurality of divided resonators utilizes leaky waves or shear horizontal waves as main waves; and
a frequency of a ripple which occurs in bandpass characteristics of the first filter due to Rayleigh waves produced in the plurality of divided resonators is included in the pass band of the second filter.

7. The filter device according to claim 1, wherein
the first filter is a ladder filter including a plurality of parallel arms that branch off from a series arm connecting the common terminal and the first individual terminal;
among the plurality of surface acoustic wave resonators, at least one surface acoustic wave resonator is disposed between the common terminal and a first branch node of the series arm at which a parallel arm branches off from the series arm as seen from the common terminal; and
among the plurality of surface acoustic wave resonators, at least one of a surface acoustic wave resonator disposed between the common terminal and the first branch node, a surface acoustic wave resonator disposed between the first branch node and a second branch node at which a parallel arm branches off from the series arm as seen from the common terminal, and a surface acoustic wave resonator disposed on the parallel arm which branches off from the first branch node of the series arm includes the plurality of divided resonators.

8. The filter device according to claim 7, wherein
each of the plurality of divided resonators utilizes leaky waves or shear horizontal waves as main waves; and
a frequency of a ripple which occurs in bandpass characteristics of the first filter due to Rayleigh waves produced in the plurality of divided resonators is included in the pass band of the second filter.

9. The filter device according to claim 1, wherein
the first filter is a ladder filter including a plurality of parallel arms that branch off from a series arm connecting the common terminal and the first individual terminal;
none of the plurality of surface acoustic wave resonators are disposed between the common terminal and a first branch node at which a parallel arm branches off from the series arm as seen from the common terminal; and
among the plurality of surface acoustic wave resonators, at least one of a surface acoustic wave resonator disposed between the first branch node and a second branch node at which a parallel arm branches off from the series arm as seen from the common terminal, a surface acoustic wave resonator disposed between the second branch node and a third branch node at which a parallel arm branches off from the series arm as seen from the common terminal, a surface acoustic wave resonator disposed on the parallel arm which branches off from the first branch node of the series arm, and a surface acoustic wave resonator disposed on the parallel arm which branches off from the second branch node of the series arm includes the plurality of divided resonators.

10. The filter device according to claim 1, wherein (Pmax−Pmin)/Pa is about 0.7% or smaller, where Pa is an average of the pitches of the interdigital transducers of the plurality of divided resonators, and Pmax and Pmin are a maximum value and a minimum value, respectively, of the pitches of the interdigital transducers of the plurality of divided resonators.

11. The filter device according to claim 1, wherein
each of the plurality of divided resonators utilizes leaky waves or shear horizontal waves as main waves; and
a frequency of a ripple which occurs in bandpass characteristics of the first filter due to Rayleigh waves produced in the plurality of divided resonators is included in the pass band of the second filter.

12. The filter device according to claim 1, wherein Pd/Pa is about 0.02% to about 0.7%, where Pd is a different in the pitch of the interdigital transducer of the divided resonator and the pitch of the interdigital transducer of the another divided resonator, and Pa is an average of the pitches of the interdigital transducers of the divided resonator and the another divided resonator.

13. A filter device comprising:
a surface acoustic wave filter including a plurality of surface acoustic wave resonators; wherein
at least one of the plurality of surface acoustic wave resonators includes a plurality of divided resonators connected in parallel with each other;
each of the plurality of divided resonators includes an interdigital transducer, and among the plurality of divided resonators, a pitch of the interdigital transducer of a divided resonator is different from a pitch of the interdigital transducer of another divided resonator;
(Pmax−Pmin)/Pa is about 0.7% or smaller, where Pa is an average of the pitches of the interdigital transducers of the plurality of divided resonators, and Pmax and Pmin are a maximum value and a minimum value, respectively, of the pitches of the interdigital transducers of the plurality of divided resonators; and
the interdigital transducers of the plurality of divided resonators are displaced from each other in a direction that is parallel or substantially parallel to an arrangement direction of electrode fingers of at least one of the plurality of divided resonators and in a direction perpendicular or substantially perpendicular to the arrangement direction of the electrode fingers.

14. The filter device according to claim 13, wherein
the plurality of surface acoustic wave resonators define a ladder filter; and
the plurality of divided resonators are disposed on at least one of a series arm and a parallel arm of the ladder filter.

15. The filter device according to claim 14, wherein the ladder filter includes a plurality of the parallel arms.

16. The filter device according to claim 13, wherein Pd/Pa is about 0.02% to about 0.7%, where Pd is a different in the pitch of the interdigital transducer of the divided resonator and the pitch of the interdigital transducer of the another divided resonator, and Pa is an average of the pitches of the interdigital transducers of the divided resonator and the another divided resonator.

17. A filter device comprising:
a substrate made of a piezoelectric material; and
a plurality of surface acoustic wave resonators disposed on the substrate and connected with each other; wherein
at least one of the plurality of surface acoustic wave resonators includes a plurality of divided resonators connected in parallel with each other;
each of the plurality of divided resonators includes an interdigital transducer, and among the plurality of divided resonators, a pitch of the interdigital transducer of a divided resonator is different from a pitch of the interdigital transducer of another divided resonator;
among the plurality of divided resonators, an arrangement direction of electrode fingers of the interdigital transducer of a divided resonator is parallel or substantially parallel with an arrangement direction of electrode fingers of the interdigital transducer of another divided resonator; and
the interdigital transducers of the plurality of divided resonators are displaced from each other in a direction that is parallel or substantially parallel to the arrangement direction of the electrode fingers and in a direction perpendicular or substantially perpendicular to the arrangement direction of the electrode fingers.

18. The filter device according to claim 17, wherein
the plurality of surface acoustic wave resonators define a ladder filter; and
the plurality of divided resonators are disposed on at least one of a series arm and a parallel arm of the ladder filter.

19. The filter device according to claim 18, wherein the ladder filter includes a plurality of the parallel arms.

20. The filter device according to claim 17, wherein Pd/Pa is about 0.02% to about 0.7%, where Pd is a different in the pitch of the interdigital transducer of the divided resonator and the pitch of the interdigital transducer of the another divided resonator, and Pa is an average of the pitches of the interdigital transducers of the divided resonator and the another divided resonator.

* * * * *